US011791149B2

(12) United States Patent
Chen et al.

(10) Patent No.: US 11,791,149 B2
(45) Date of Patent: Oct. 17, 2023

(54) AXIALLY PROGRESSIVE LENS FOR TRANSPORTING CHARGED PARTICLES

(71) Applicant: Agilent Technologies, Inc., Santa Clara, CA (US)

(72) Inventors: Tong Chen, San Jose, CA (US); Curt A. Flory, Los Altos, CA (US); Gershon Perelman, Cupertino, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 69 days.

(21) Appl. No.: 17/631,393

(22) PCT Filed: Jul. 16, 2020

(86) PCT No.: PCT/US2020/042388
§ 371 (c)(1),
(2) Date: Jan. 28, 2022

(87) PCT Pub. No.: WO2021/021459
PCT Pub. Date: Feb. 4, 2021

(65) Prior Publication Data
US 2022/0336199 A1    Oct. 20, 2022

Related U.S. Application Data

(60) Provisional application No. 62/881,284, filed on Jul. 31, 2019.

(51) Int. Cl.
*H01J 49/06* (2006.01)
*H01J 37/12* (2006.01)
(52) U.S. Cl.
CPC ............ *H01J 49/067* (2013.01); *H01J 37/12* (2013.01); *H01J 2237/1215* (2013.01); *H01J 2237/1534* (2013.01)

(58) Field of Classification Search
CPC .. H01J 49/067; H01J 37/12; H01J 2237/1215; H01J 2237/1534
See application file for complete search history.

(56) References Cited

U.S. PATENT DOCUMENTS 6,107,628 A * 8/2000 Smith .................. H01J 49/066
250/292
6,111,250 A    8/2000 Thomson et al.
(Continued)

OTHER PUBLICATIONS

Cooks, R. Graham et al.; Ion Optics; MS Short Course at Tsinghua; Lecture 8-9; Mass Analyzer and MS Instrumentation; Jul. 2, 2011; 70 pages.
(Continued)

*Primary Examiner* — Sean M Luck

(57) ABSTRACT

An electrostatic lens for transporting charged particles in an axial direction includes a first group of first electrodes configured to receive a first DC potential from a DC voltage source, and a second group of second electrodes configured to receive a second DC potential from the DC voltage source different from the first DC potential. The first electrodes are interdigitated with the second electrodes. The first group and/or the second group has a geometric feature that progressively varies along the axial direction. The lens generates an axial potential profile that progressively changes along the axial direction, and thereby reduces geometrical aberrations. The lens may be part of a charged particle processing apparatus such as, for example, a mass spectrometer or an electron microscope.

20 Claims, 15 Drawing Sheets

(56) References Cited

U.S. PATENT DOCUMENTS

| | | | |
|---|---|---|---|
| 6,727,495 B2* | 4/2004 | Li | G01N 27/622 250/281 |
| 7,391,021 B2* | 6/2008 | Stoermer | H01J 49/065 250/292 |
| 7,459,693 B2* | 12/2008 | Park | H01J 49/066 250/396 R |
| 8,124,930 B2 | 2/2012 | Wang | |
| 8,324,565 B2* | 12/2012 | Mordehai | H01J 49/066 250/281 |
| 8,481,963 B2 | 7/2013 | Loucks, Jr. et al. | |
| 8,946,625 B2* | 2/2015 | Nikolaev | H01J 49/38 250/281 |
| 9,209,006 B2* | 12/2015 | Kalinitchenko | H01J 49/062 |
| 9,466,473 B2* | 10/2016 | Giles | H01J 49/065 |
| 2004/0195503 A1* | 10/2004 | Kim | H01J 49/066 250/288 |
| 2006/0169892 A1* | 8/2006 | Baba | H01J 49/005 250/291 |
| 2010/0038533 A1 | 2/2010 | Makarov et al. | |
| 2010/0308218 A1* | 12/2010 | Wang | H01J 49/063 250/282 |
| 2011/0012017 A1* | 1/2011 | Nishiguchi | H01J 49/063 250/281 |
| 2011/0147584 A1 | 6/2011 | Kim et al. | |
| 2013/0175441 A1* | 7/2013 | Zanon | H01J 49/066 250/288 |
| 2013/0187044 A1* | 7/2013 | Ding | H01J 49/066 250/292 |
| 2014/0339414 A1 | 11/2014 | Loboda | |
| 2015/0206731 A1* | 7/2015 | Zhang | H01J 49/005 250/396 R |
| 2015/0371839 A1* | 12/2015 | Yasuno | H01J 49/066 250/289 |
| 2016/0181080 A1* | 6/2016 | Williams | H01J 49/065 250/292 |
| 2016/0260594 A1* | 9/2016 | Hendricks | H01J 49/24 |
| 2018/0005812 A1* | 1/2018 | Mavanur | H01J 49/005 |
| 2018/0012747 A1 | 1/2018 | Wouters et al. | |
| 2020/0152437 A1* | 5/2020 | Ryan | H01J 49/062 |

OTHER PUBLICATIONS

Egerton, R.F., Electron Optics; Physical Principles of Electron Microscopy, An Introduction to TEM, SEM and AEM; http://www.springer.com/978-0-387-25800-3; chapter 2; 2005, XII, 30 pages.

PCT International Search Report & Written Opinion dated Oct. 15, 2020 for Application No. PCT/US2020/042388; 10 pages.

* cited by examiner

Angular Aberration(Spherical Aberration): $r(z) = (r|aaa)a_0^3$

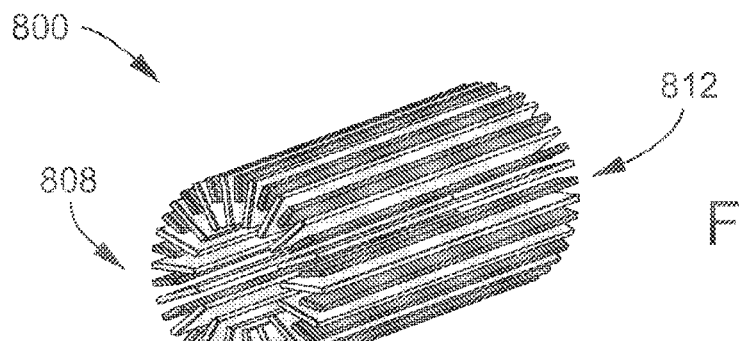
FIG. 8A
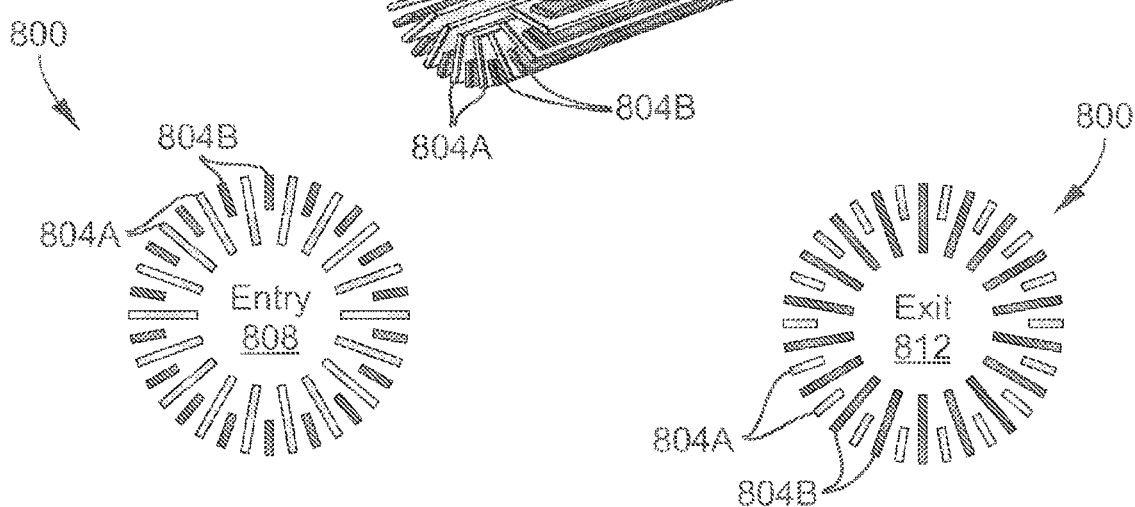
FIG. 8B
FIG. 8C
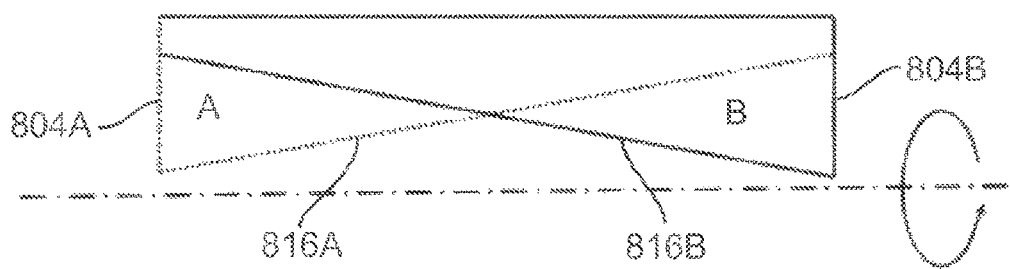
FIG. 8D

AXIALLY PROGRESSIVE LENS FOR TRANSPORTING CHARGED PARTICLES

RELATED APPLICATIONS

This application is the national stage under 35 U.S.C. 371 of International Application No. PCT/US2020/042388, filed Jul. 16, 2020; which claims the benefit under 35 U.S.C. § 119(e) of U.S. Provisional Patent Application Ser. No. 62/881,284, filed Jul. 31, 2019, titled "AXIALLY PROGRESSIVE LENS FOR TRANSPORTING CHARGED PARTICLES," the entire contents of each of which are incorporated by reference herein.

TECHNICAL FIELD

The present invention relates to electrostatic lenses for use in a variety of scientific instruments, e.g., electron microscope, mass spectrometer, etc., to transport charged particles, e.g., electrons, ions, etc.

BACKGROUND

Electrostatic lenses are widely used in a variety of scientific instruments, e.g., electron microscope, mass spectrometer, etc., to transport charged particles (e.g., electrons, ions, etc.). FIGS. 1A-1D are schematics of electron and ion trajectories in an electron microscope and a mass spectrometer, respectively. The required final states of charged particles in phase space are typically different from application to application, in terms of the shape and volume of the phase-space distribution. FIGS. 1B and 1D show the desired particle phase-space distribution for an electron microscope and a mass spectrometer, respectively. For example, an electron microscope demands a sharp focusing point at the sample on a sample stage in order to obtain an image of higher resolution, corresponding to a spatial spread that is as narrow as possible (see FIGS. 1A and 1B). On the other hand, a mass analyzer of a time-of-flight (TOF) mass spectrometer (i.e., a TOF analyzer) requires parallel ion beam injection into the orthogonal accelerator, corresponding to a velocity spread that is as narrow as possible (see FIGS. 1C and 1D).

FIGS. 2A-2C are schematics showing a conventional electrostatic lens composed of two opposing hollow cylindrical electrodes 22, 24, arranged in axial series along the longitudinal axis of the lens with an axial gap therebetween, and the results of applying different voltages ($V^+$ and $V^-$) to the electrodes 22, 24. Indeed, a typical/simplest electrostatic lens comprises two hollow cylindrical electrodes 22, 24 with different voltages supplied. Parallel ions injected from the right are focused on the left. The horizontal-type lines in FIG. 2B are the ion trajectories, whereas the curved lines in FIG. 2B crossing the ion trajectories are equipotential lines representing the electrostatic field generated in the lens by applying the voltages $V^+$ and $V^-$. The electrostatic potential of such an electrostatic lens is expressed by the equation:

$$U = \sum_n \frac{2}{n\pi} \frac{I_0(2n\pi r/L)}{I_0(2n\pi R/L)} \sin\left(\frac{2n\pi z}{L}\right)[1-(-1)^n] + \sum_m \frac{2}{\lambda_m} \frac{J_0(\lambda_m r/R)}{J_1(\lambda_m)} \frac{\sinh(\lambda_m z/R)}{\sinh(\lambda_m L/2R)} \approx$$

$$C_0(z) + C_2(z)r^2 + C_4(z)r^4 + \dots$$

This equation can be expanded as a power series in r. When an ion propagates axially by a finite distance, dz, in the electrostatic lens, the ion's trajectory will be bent due to the radial electric force by an angle ($\alpha_0 - \alpha$), and the radial displacement increases by ($r - r_0$), as illustrated in FIG. 2C. According to the Newtonian equation with electric potential truncated at the second order term (paraxial approximation), ion motion is described by:

$$m\ddot{r} = E_r q = -\frac{\partial U}{\partial r} q \approx -2C_2 r q$$

Applying the relation below, $$\ddot{r} = \frac{d^2 r}{dz^2} \cdot \left(\frac{dz}{dt}\right)^2 = r'' v_z^2$$

assuming $v_z$ remains constant, by defining:

$$k^2 = \frac{C_2 q}{m v_z^2}$$

then the ion's propagation can be described by the transfer matrix:

$$\binom{r}{a} = \binom{(r|r) \ (r|a)}{(a|r) \ (a|a)}\binom{r_0}{a_0} = \binom{\cos(k \cdot dz) \quad k^{-1}\sin(k \cdot dz)}{-k\sin(k \cdot dz) \quad \cos(k \cdot dz)}$$

where $r_0$ and $\alpha_0$ are the initial radial offset and divergent angle respectively for the specific ion. The trajectory over a certain distance can be viewed as a series of such small movements over dz, represented by the sequential product of a series of transfer matrices:

$$\binom{r}{a} = \prod_i \binom{\cos(k_i \cdot dz) \quad k_i^{-1}\sin(k_i \cdot dz)}{-k_i\sin(k_i \cdot dz) \quad \cos(k_i \cdot dz)}\binom{r_0}{a_0}$$

FIGS. 3A-3D are schematics showing ion trajectories bending and aberrations in the ion trajectories associated with the conventional electrostatic lens. When the higher order terms in the electric potential are considered, aberrations appear as follows:

$r(z)=(r|r)r_0+(r|a)a_0+(r|rrr)r_0^3+(r|aaa)a_0^3+(r|arr)a_0 r_0^2+(r|aar)a_0^2 r_0+\dots$ $a(z)=(a|r)r_0+(a|a)a_0+(a|rrr)r_0^3+(a|aaa)a_0^3+(a|arr)a_0 r_0^2+(a|aar)a_0^2 r_0+\dots$ where, in the above two equations for r(z) and a(z), the first two terms in each equation collectively define a first order paraxial approximation, the next four terms (third, fourth, fifth, and sixth terms) in each equation collectively define third order geometric aberrations, and the ellipses represent additional terms defining higher order geometric aberrations.

FIGS. 3A and 3B illustrate the position aberration, also called distortion, which is described as:

$r(z)=(r|rrr)r_0^3$

FIGS. 3C and 3D illustrate the angular aberration, also called spherical aberration, which is described as:

$r(z)=(r|aaa)a_0^3$

In both cases, ions of large initial offset displacements or large initial angles cannot be focused at the main focal planes, which in turn adds difficulties in subsequent ion manipulation by downstream optics. It has been strictly proven by Scherzer, Otto. "Über einige Fehler von Elektronenlinsen" (On some aberrations of electron lenses), Zeitschrift für Physik. Vol. 101, Issue 9-10, p. 593-603 (1936), that third-order aberrations cannot be eliminated in rotationally symmetric electrostatic lenses. Such aberrations increase the difficulties of manipulating ions by electrostatic lenses, yielding imperfect ion phase-space distribution at the final state. Extensive efforts in the community have been spent on reducing aberrations.

SUMMARY

To address the foregoing problems, in whole or in part, and/or other problems that may have been observed by persons skilled in the art, the present disclosure provides methods, processes, systems, apparatus, instruments, and/or devices, as described by way of example in implementations set forth below.

According to one embodiment, an electrostatic lens for transporting charged particles in an axial direction includes: a first group of first electrodes configured to receive a first DC potential from a DC voltage source and generate a first electrostatic field; and a second group of second electrodes configured to receive a second DC potential from the DC voltage source different from the first DC potential and generate a second electrostatic field, wherein: the first electrodes are interdigitated with the second electrodes; the first group and the second group define a lens interior extending along the lens axis from a lens entrance to a lens exit; at least one of the first group or the second group has a geometric feature that progressively varies along the axial direction; the first group and the second group are configured to generate a composite electrostatic field in the lens interior comprising a superposition of the first electrostatic field and the second electrostatic field; and the first group and the second group define a transition region through which a ratio of respective field strengths of the first electrostatic field and the second electrostatic field progressively varies along the axial direction in accordance with the progressively varying geometric feature.

According to another embodiment, an electrostatic lens for transmitting charged particles in an axial direction includes: a first group of first electrodes configured to receive a first DC potential from a DC voltage source; and a second group of second electrodes configured to receive a second DC potential from the DC voltage source different from the first DC potential, wherein: the first group and the second group surround a lens entrance, a lens exit, and a lens interior extending along a lens axis from the lens entrance to the lens exit; and the first group and the second group are configured to generate an axial potential profile in the lens interior that progressively changes along the axial direction and progressively spreads focusing power along the axial direction.

According to another embodiment, a charged particle processing apparatus includes: the electrostatic lens of any of the embodiments disclosed herein; and a charged particle receiver configured to receive charged particles from the electrostatic lens.

According to another embodiment, a method for transporting charged particles in an axial direction includes: supplying charged particles to a lens interior of the electrostatic lens of any of the embodiments disclosed herein; and applying the first DC potential to the first electrodes and the second DC potential to the second electrodes to generate an axial potential profile in the lens interior to which the charged particles are subjected, wherein the axial potential profile progressively changes along the axial direction and progressively spreads focusing power along the axial direction.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention can be better understood by referring to the following figures. The components in the figures are not necessarily to scale, emphasis instead being placed upon illustrating the principles of the invention. In the figures, like reference numerals designate corresponding parts throughout the different views.

FIG. 8A is a schematic perspective view of an example of an axially progressive electrostatic lens (AP lens) for transporting charged particles according to an embodiment of the present disclosure.

FIG. 8B is a schematic end view of the AP lens illustrated in FIG. 8A at an entrance thereof.

FIG. 8C is a schematic end view of the AP lens illustrated in FIG. 8A at an exit thereof, which is axially opposite to the entrance illustrated in FIG. 8B.

FIG. 8D is a schematic side (lengthwise) view of a pair of electrodes of the AP lens illustrated in FIG. 8A in a position after assembly of the electrostatic lens illustrated in FIG. 8A.

DETAILED DESCRIPTION

As will become evident from the following description, embodiments disclosed herein provide an electrostatic lens referred to herein as an axially progressive lens (AP lens). The AP lens is configured to generate an electrostatic potential profile that changes (varies) in the axial direction (i.e., the longitudinal dimension of the AP lens) in which the charged particles are transmitted through the AP lens according to a predefined function. This axially progressive electrostatic potential profile is effective to progressively spread focusing power across a predefined axial distance. The characteristic or function of the axially progressive electrostatic potential profile is based on the geometries of the electrodes serving as lens elements, as described in detail below. As so configured, the AP lens is effective to significantly reduce geometrical aberrations in the charged particle (e.g., ion or electron) beam, thereby significantly improving charged particle transmission while delivering a charged particle beam having the same or better phase-space distribution, as compared to known electrostatic lenses. In some embodiments, the AP lens is configured in effect to generate two (or more) characteristic electrostatic potential profiles that are progressively transformed from or into each other (i.e., from one profile to another profile) in the axial direction according to a predefined function or functions. A few non-exclusive examples of embodiments of the AP lens and associated apparatuses and systems are described below.

Figure 4:
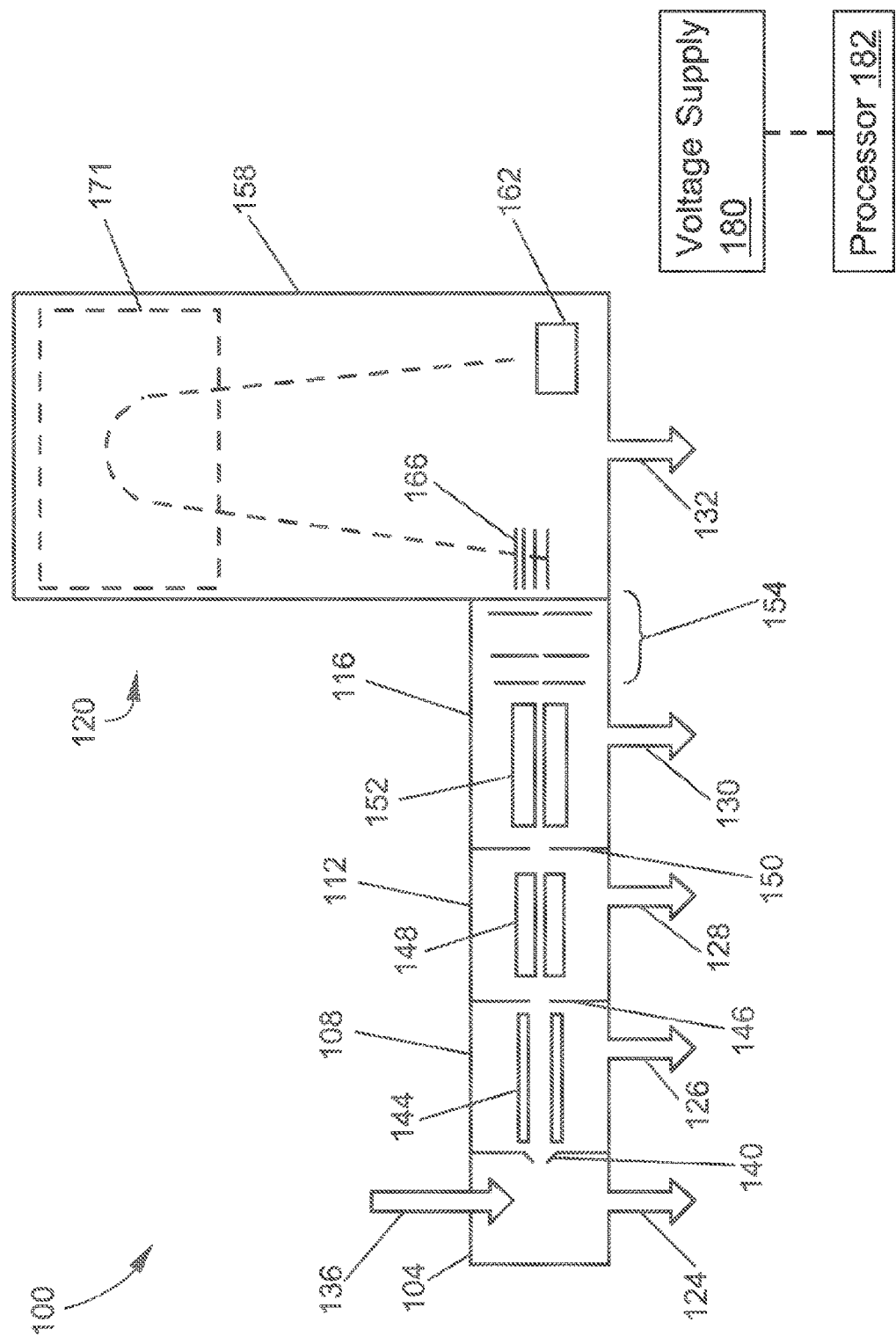
FIG. 4 is a schematic view of an example of a mass spectrometry (MS) system in which an axially progressive electrostatic lens (AP lens) according to the present disclosure may be provided.

FIG. 4 is a schematic view of an example of a mass spectrometry (MS) system 100 in which an axially progressive electrostatic lens (AP lens) according to the present disclosure may be provided. The operation and design of various components of mass spectrometry systems are generally known to persons skilled in the art, and thus are only briefly described herein to facilitate an understanding of the present disclosure.

The MS system 100 may generally include an ion source 104, one or more ion transfer devices 108, 112, and 116 (or ion processing devices), and a mass spectrometer (MS) 120. Three ion transfer devices 108, 112, and 116 are illustrated by example only, as other embodiments may include more than three, less than three, or none. The MS system 100 includes a plurality of chambers arranged in series such that each chamber communicates with at least one adjacent (upstream or downstream) chamber. Each of the ion source 104, ion transfer devices 108, 112, and 116, and MS 120 includes at least one of these chambers. Thus, the MS system 100 defines a flow path for ions and gas molecules generally from the chamber of the ion source 104, through the chambers of the ion transfer devices 108, 112, and 116, and into the chamber of the MS 120. From the perspective of FIG. 4, the flow path is generally directed from the left to the right. Each chamber is physically separated from an adjacent chamber by at least one structural boundary. e.g., a wall. The wall includes at least one opening to accommodate the flow path. The wall opening may be quite small relative to the overall dimensions of the chambers, thus serving as a gas conductance barrier that limits transfer of gas from a preceding chamber to a succeeding chamber, and facilitating independent control of respective vacuum levels in adjacent chambers. The wall may serve as an electrode or ion optics component. Alternatively or additionally, electrodes and/or ion optics components may be mounted to or positioned proximate to the wall. Any of the chambers may include one or more ion guides, such as a linear multipole ion guide (e.g., quadrupole, hexapole, octopole, etc.) or an ion funnel.

At least some of the chambers may be considered to be pressure-reducing chambers, or vacuum stages, that operate at controlled, sub-atmospheric internal gas pressures. For this purpose, the MS system 100 includes a vacuum system communicating with vacuum ports of such chambers. In the illustrated embodiment, each of the ion source 104, ion transfer devices 108, 112, and 116, and MS 120 includes at least one chamber having a respective vacuum port 124, 126, 128, 130, and 132 that communicates with a vacuum system. Generally, when the MS system 100 is operated to analyze a sample, each chamber successively reduces the gas pressure below the level of the preceding chamber, ultimately down to the very low vacuum-level required for operating the MS 120 (e.g., ranging from $10^{-4}$ to $10^{-9}$ Torr).

The ion source 104 may be any type of continuous-beam or pulsed ion source suitable for producing analyte ions for mass spectral analysis. Examples of ion sources 104 include, but are not limited to, electrospray ionization (ESI) sources, photo-ionization (PI) sources, electron ionization (EI) sources, chemical ionization (CI) sources, field ionization (FI) sources, plasma or corona discharge sources, laser desorption ionization (LDI) sources, and matrix-assisted laser desorption ionization (MALDI) sources. Some of the examples just noted are, or may optionally be, atmospheric pressure ionization (API) sources in that they operate exclusively at or near atmospheric pressure such as ESI sources, or may be configured to do so such as atmospheric pressure photo-ionization (APPI) sources and atmospheric pressure chemical ionization (APCI) sources. An API source nonetheless includes a vacuum port 124 (exhaust port) by which gas, contaminants, etc. may be removed from the chamber. The chamber of the ion source 104 is an ionization chamber in which sample molecules are broken down to analyte ions by an ionization device (not shown). The sample to be ionized may be introduced to the ion source 104 by any suitable means, including hyphenated techniques in which the sample is an output 136 of an analytical separation instrument such as, for example, a gas chromatography (GC) or liquid chromatography (LC) instrument (not shown). The ion source 104 may include a skimmer 140 (or two or more skimmers axially spaced from each other), also referred to as a skimmer plate, skimmer cone, or sampling cone. The skimmer 140 has a central aperture. The skimmer 140 is configured for preferentially allowing ions to pass through to the next chamber while blocking non-analyte components. The ion source 104 may also include other components (electrodes, ion optics, etc., not shown) useful for organizing as-produced ions into a beam that may be efficiently transferred into the next chamber. Voltages on the ion optics can be supplied from an appropriate voltage supply 180 operated or controlled by an appropriate electronic processor 182.

The first ion transfer device 108 may be configured primarily as a pressure-reducing stage. For this purpose, the ion transfer device 108 may include ion transfer optics 144 configured for keeping the ion beam focused along a main optical axis of the MS system 100. The ion transfer optics 144 may have various configurations known to persons skilled in the art, such as, for example, a multipole arrangement of electrodes elongated along the axis (e.g., a multipole ion guide), a serial arrangement of ring electrodes, an ion funnel, a split cylinder electrode, etc. In some embodiments, the ion transfer optics 144 may be configured as an ion trap. One or more lenses 146 may be positioned between the ion transfer device 108 and the adjacent ion transfer device 112.

The second ion transfer device 112 may be configured as a mass filter or an ion trap configured for selecting ions of a specific m/z ratio or m/z ratio range. For this purpose, the ion transfer device 108 may include ion transfer optics 148 such as a multipole arrangement of electrodes (e.g., a quadrupole mass filter). One or more lenses 150 may be positioned between the ion transfer device 112 and the adjacent ion transfer device 116. In other embodiments, the ion transfer device 112 may be configured primarily as a pressure-reducing stage.

The third ion transfer device 116 may be configured as a cooling cell. For this purpose, the ion transfer device 116 may include ion transfer optics 152 such as a multipole arrangement of electrodes, configured as a non-mass-resolving, RF-only device. A cooling gas (or damping gas) such as, for example, argon, nitrogen, helium, etc., may be flowed into the chamber of the ion transfer device 116 to cool down (or "thermalize," i.e., reduce the kinetic energy of) the ions by way of collisions between the ions and the gas molecules. In other embodiments, the ion transfer device 116 may be configured as an ion fragmentation device such as a collision cell. In one example, ion fragmentation is accomplished by way of collision induced dissociation (CID), in which case the gas added to the chamber (the "collision gas") results in a gas pressure sufficient to enable fragmentation by CID. In other embodiments, the ion transfer device 116 may be configured primarily as a pressure-reducing stage.

Ion beam shaping optics 154 may be positioned between the ion transfer device 116 and the MS 120. In an embodiment of the present disclosure, the ion beam shaping optics 154 may be or include an AP lens configured according to the principles of the invention disclosed herein.

The MS 120 may be any type of MS. The MS 120 generally includes a mass analyzer 158 and an ion detector 162. In the illustrated embodiment, by example only, the MS 120 is depicted as a time-of-flight mass spectrometer (TOFMS). In this case, the mass analyzer 158 includes an evacuated, electric field-free flight tube into which ions are injected by an ion pulser 166 (or ion pusher, ion puller, ion extractor, ion accelerator, etc.). As appreciated by persons skilled in the art, the beam shaping optics 154 direct the ion beam into the ion pulser 166, which pulses the ions into the flight tube as ion packets. The ions drift through the flight tube toward the ion detector 162. Ions of different masses travel through the flight tube at different velocities and thus have different overall times-of-flight, i.e., ions of smaller masses travel faster than ions of larger masses. Each ion packet spreads out (is dispersed) in space in accordance with the time-of-flight distribution. The ion detector 162 detects and records the time that each ion arrives at (impacts) the ion detector 162. A data acquisition device then correlates the recorded times-of-flight with m/z ratios. The ion detector 162 may be any device configured for collecting and measuring the flux (or current) of mass-discriminated ions outputted from the mass analyzer 158. Examples of ion detectors include, but are not limited to, multi-channel plates, electron multipliers, photomultipliers, and Faraday cups. In some embodiments, as illustrated, the ion pulser 166 accelerates the ion packets into the flight tube in a direction orthogonal to the direction along which the beam shaping optics 154 transmit the ions into the ion pulser 166, which is known as orthogonal acceleration TOF (oa-TOF). In this case, the flight tube often includes an ion mirror (or reflectron) 171 to provide a 180° reflection or turn in the ion flight path for extending the flight path and correcting the kinetic energy distribution of the ions. In other embodiments, the MS 120 may include another type of mass analyzer such as, for example, a mass filter, an ion trap, an ion cyclotron resonance (ICR) cell, an electrostatic ion trap, or a static electric and/or magnetic sector analyzer.

In operation, a sample is introduced to the ion source 104. The ion source 104 produces sample ions (analyte ions and background ions) from the sample and transfers the ions to one or more ion transfer devices 108, 112, and 116. The ion transfer device(s) 108, 112, and 116 transfer the ions through one or more pressure-reducing stages and into the MS 120. Depending on what type or types of ion transfer devices 108, 112, and 116 are included, the ion transfer device(s) 108, 112, and 116 may perform additional ion processing operations such as mass filtering, ion fragmentation, beam shaping, etc., as described above. The MS 120 mass-resolves the ions as described above. The measurement signals outputted from the ion detector 162 are processed by electronics of the MS system 100 to produce analytical data such as mass spectra, chromatograms, etc.

In the present embodiment, the ion beam shaping optics 154 focus the ion beam and transmit the ions into the entrance of the MS 120, specifically into the ion pulser 166 in the illustrated example. The focusing and transmission of the ions at the stage depicted by the ion beam shaping optics 154 entail implementing the concept of the AP lens described herein.

Figure 5A:
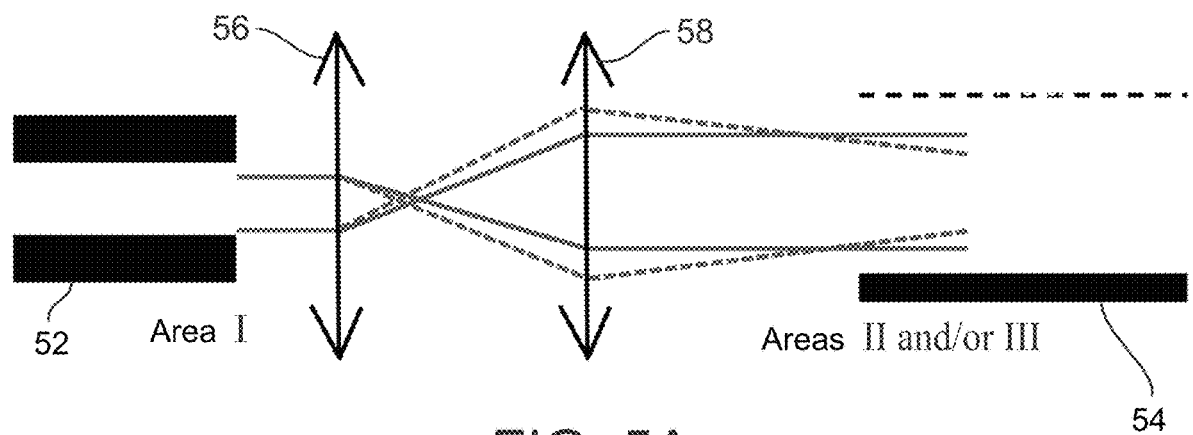
FIG. 5A is a schematic view of a telescopic lens arrangement positioned between an RF ion guide and an ion pusher, for example as may be provided in a quadrupole time-of-flight (QTOF) mass spectrometer.
Figure 5B:
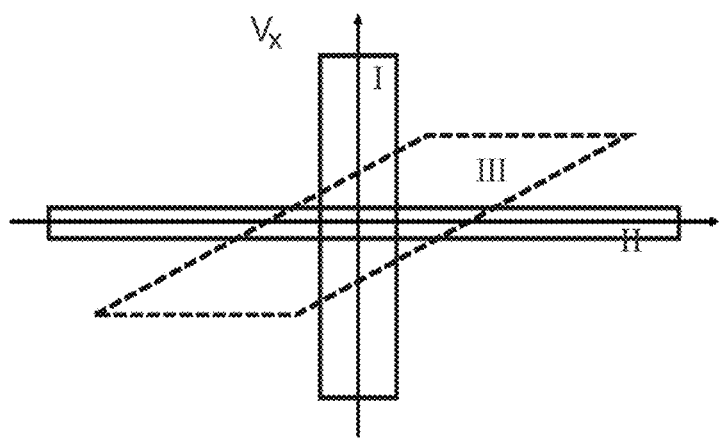
FIG. 5B is a schematic depicting the phase-space distribution corresponding to the different states depicted in FIG. 5A.

FIG. 5A is a schematic view of a telescopic lens arrangement positioned between an RF ion guide 52 (e.g., a quadrupole ion guide) and an ion pusher 54. The telescopic lens arrangement may be utilized, for example, in a quadrupole time-of-flight (QTOF) mass spectrometer for focusing and transporting ions from the exit end of the ion guide 52 into ion pusher 54. The ion pusher 54 then accelerates the ions (typically in a direction orthogonal to the lens axis) into the flight tube of the TOF analyzer in the known manner. As an example, the telescopic lens arrangement is formed by a first electrostatic lens (or first set of lenses) 56 and a second electrostatic lens (or second set of lenses) 58. Typically, ions at the exit of the RF ion guide 52 are, relatively speaking, of small spatial distribution and large velocity distribution in the transverse dimension orthogonal to the lens axis, corresponding to a phase-space distribution represented by Area I in FIG. 5B. Ideally, as depicted by solid lines in FIG. 5A, ions would be first converged by the first set of lenses 56 and then transformed by the second set of lenses 58 into a collimated beam parallel to the lens axis when injected into the orthogonal accelerator region of the ion pusher 54, corresponding to a final phase-space distribution represented by Area II in FIG. 5B. However, due to the aberrations described herein, ions are usually not focused on the same point after the first set of lenses 56, and consequently cannot be transformed into parallel rays by the second set of lenses 58, as depicted by dashed lines in FIG. 5A, which situation corresponds to a phase-space distribution represented by Area III in FIG. 5B.

Figure 1A:
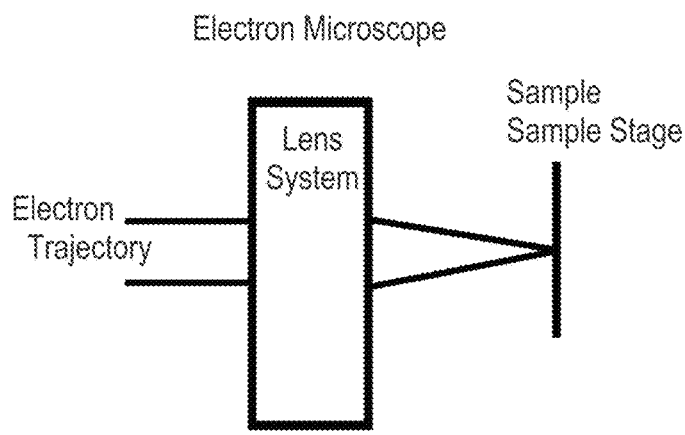
FIG. 1A is a schematic view of an electron microscope, or at least a portion of an electron microscope at which an electrostatic lens is provided.
Figure 1B:
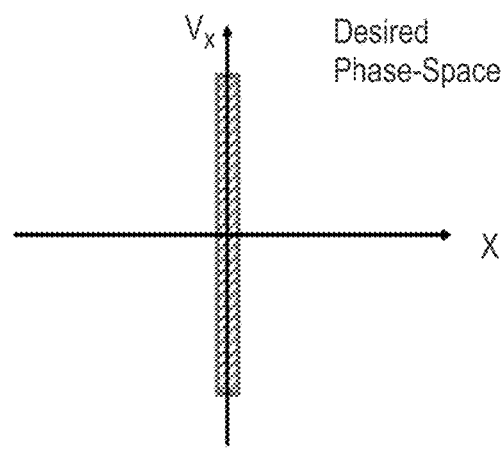
FIG. 1B is a schematic view of a desired phase-space distribution for an electron beam outputted from the electrostatic lens depicted in FIG. 1A, in which the abscissa represents position along an x-axis and the ordinate represents electron velocity.
Figure 1C:
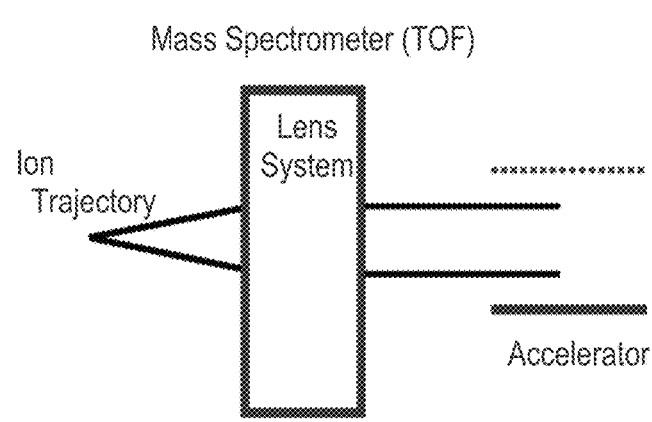
FIG. 1C is a schematic view of a time-of-flight (TOF) mass spectrometer, or at least a portion of a TOF mass spectrometer at which an electrostatic lens is provided.
Figure 1D:
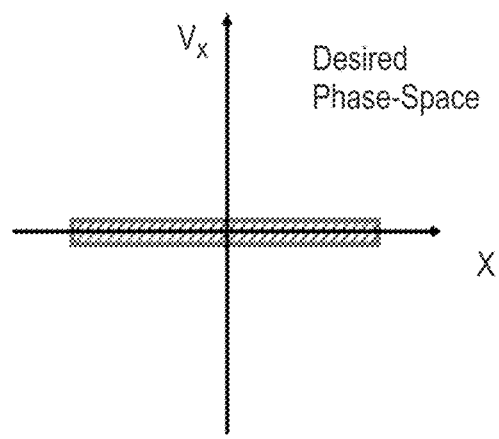
FIG. 1D is a schematic view of a desired phase-space distribution for an ion beam outputted from the electrostatic lens depicted in FIG. 1C, in which the abscissa represents position along an x-axis and the ordinate represents ion velocity.
Figure 2A:
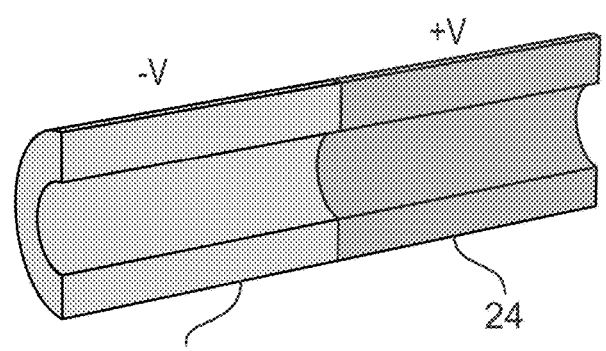
FIG. 2A is a schematic cut-away perspective view of an electrostatic lens composed of two opposing hollow cylindrical electrodes to which different voltages $V^+$ and $V^-$ are applied.
Figure 2B:
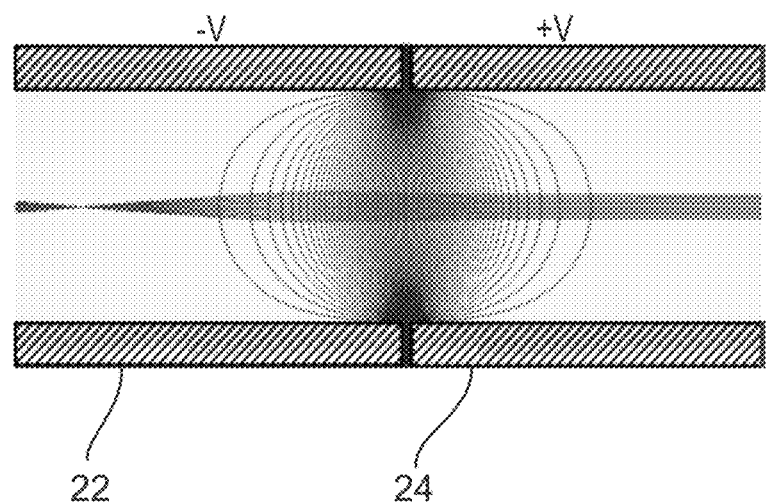
FIG. 2B is a schematic cross-sectional side (lengthwise) view of the electrostatic lens illustrated in FIG. 2A, and further depicting the equipotential lines of the applied electrostatic field and the resulting charged particle beam.
Figure 2C:
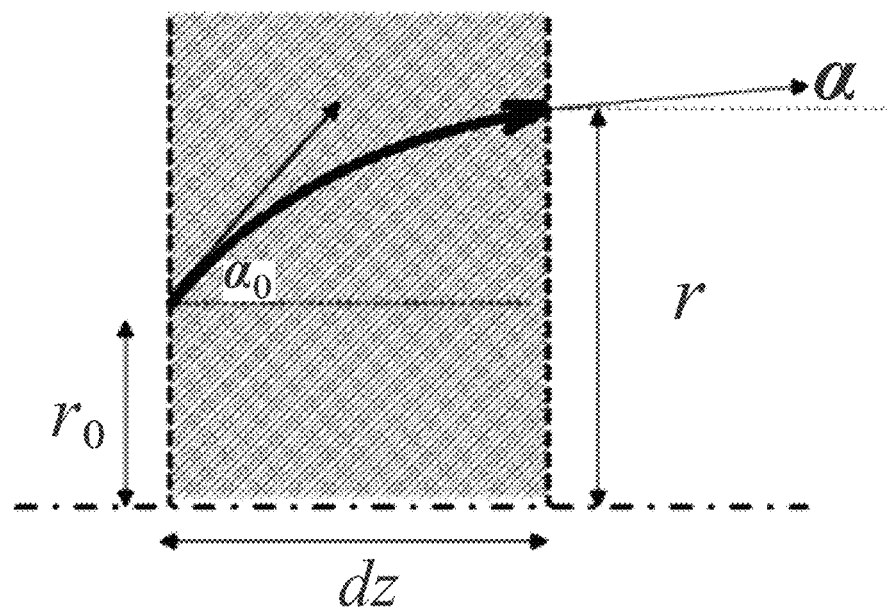
FIG. 2C is a schematic depiction of an ion trajectory being bent due to a radial electric force applied by the electrostatic lens of FIGS. 2A and 2B.
Figure 3A:
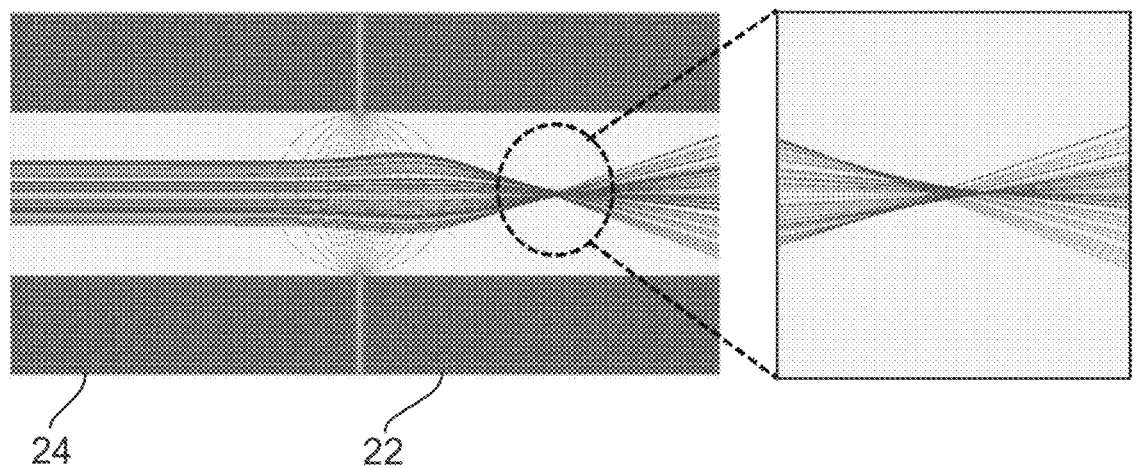
FIG. 3A is a schematic cross-sectional side (lengthwise) view of an electrostatic lens composed of two opposing hollow cylindrical electrodes to which different voltages $V^+$ and $V^-$ are applied, similar to FIG. 2A, and illustrating position aberration (distortion) of the ion beam.
Figure 3B:
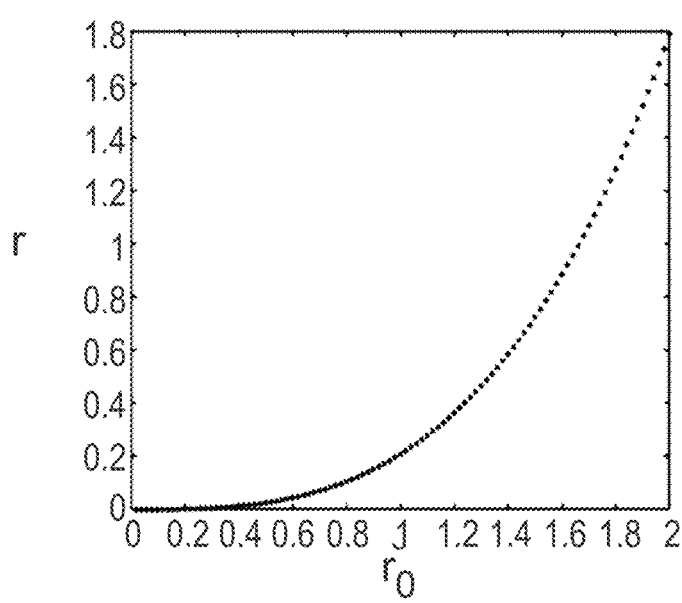
FIG. 3B is a plot illustrating the position aberration (distortion) of an ion transported by the electrostatic lens of FIG. 3A, in which the radial position r of the ion is plotted as a function of the initial radial position (or offset) $r_0$ of the ion.
Figure 3C:
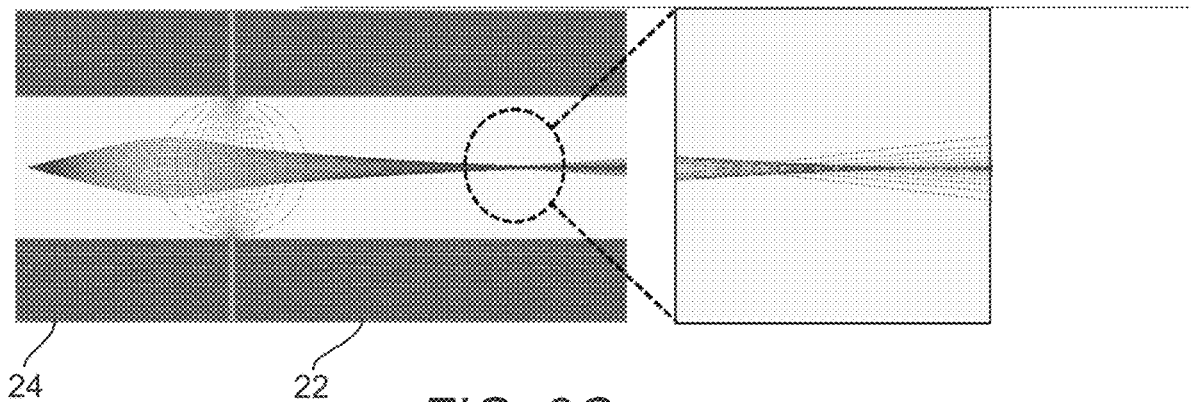
FIG. 3C is a schematic cross-sectional side (lengthwise) view of an electrostatic lens composed of two opposing hollow cylindrical electrodes to which different voltages $V^+$ and $V^-$ are applied, similar to FIG. 2A, and illustrating angular aberration (spherical aberration) of the ion beam.
Figure 3D:
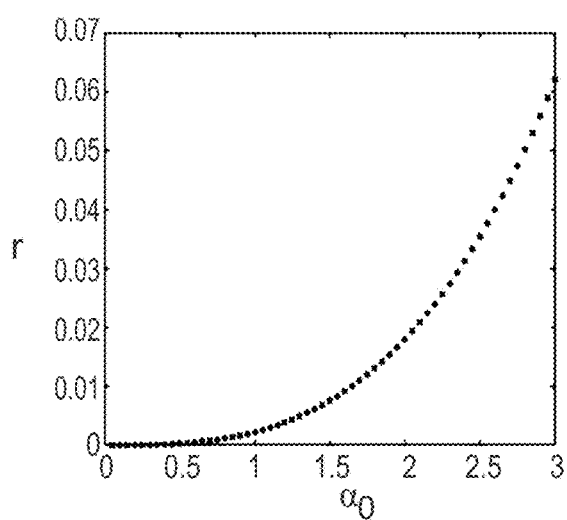
FIG. 3D is a plot illustrating the angular aberration (spherical aberration) of an ion transported by the electrostatic lens of FIG. 3C, in which the divergent angle α of the ion is plotted as a function of the initial divergent angle $α_0$ of the ion.
Figure 6:
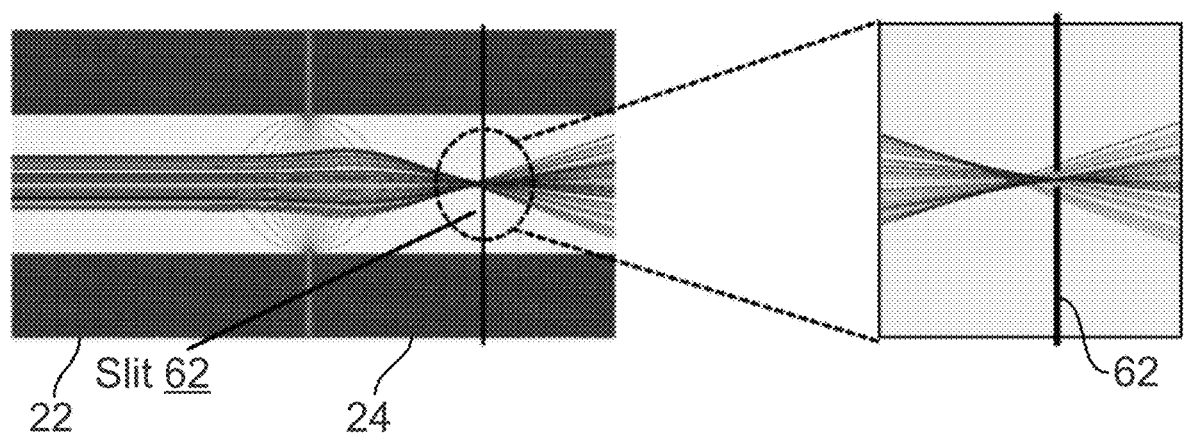
FIG. 6 is a schematic cross-sectional side (lengthwise) view of an electrostatic lens composed of two opposing hollow cylindrical electrodes to which different voltages $V^+$ and $V^-$ are applied, similar to FIG. 3A, and illustrating the use of a conventional ion slicer, and further including an inset depicting the loss of ions at the ion slicer.

FIG. 6 is a schematic cross-sectional side (lengthwise) view of an electrostatic lens composed of two axially opposing hollow cylindrical electrodes 22, 24 to which different voltages $V^+$ and $V^-$ are applied, similar to FIG. 3A. FIG. 6 illustrates a conventional approach involving the provision of a slit 62 positioned at the focal plane of the electrostatic lens. The slit 62 serves as an ion slicer to "aperture" the ion beam. With this type of beam shaping, the slit 62 rejects ions corresponding to large aberrations, leading to reduced aberrations for ion propagation in downstream optics. However, the inventors have found that this conventional approach inadequately addresses the long felt but unsolved need of reducing aberrations. In particular, while this approach reduces aberrations, it does so at the expense of ion transmission efficiency and contamination of the electrostatic lens, leading to a significant decrease in sensitivity of the associated ion measurement instrument (e.g., mass spectrometer). The inset of FIG. 6 depicts the loss of ions at the slit 62. Also, as time passes by with continued use of the electrostatic lens, ions caught/accumulated at the edges of the ion slicer gradually build up a patch potential which deflects the ion trajectories and induces further aberrations. Another example of a known ion slicer is described in U.S. Pat. No. 8,481,963, the entire content of which is incorporated by reference herein.

According to the present disclosure, an axially progressive electrostatic lens (AP lens) is provided. The AP lens is configured to reduce geometrical aberrations by progressively spreading focusing power across an axial distance. i.e., a predetermined axial distance corresponding to all or part of the axial length of the electrode structure defining the AP lens. The AP lens accomplishes this by creating an electrostatic potential field having an electrostatic potential profile that progressively changes (varies, or transitions) in the axial direction, according to a predetermined function that preferably optimizes focusing power and minimizes geometrical aberrations. The function characterizing the axially progressive variance in the electrostatic potential field may be in the manner of a gradient which, depending on the electrode structure of the AP lens, may be a (substantially) continuous or step-wise gradient, and in either case may be gradual or at least not abrupt like in conventional electrostatic lenses. The progressively spreading focusing power may, in a sense, be analogized to the effect of a gradient-index lens utilized in light optics.

The AP lens may be employed, for example, to eliminate the need for the aforementioned ion-beam slicer/aperture, resulting in a substantial increase in ion transmission while delivering an ion beam of the same or better phase-space distribution. The AP lens is suitable for a mass spectrometer such as, for example, one utilizing a TOF mass analyzer, or other types of ion analyzing instruments such as an ion mobility spectrometer. The AP lens may also have applications in other areas where electrostatic lenses of reduced aberrations are required or desirable, such as ion mirrors, ion deflectors, electrostatic ion traps, and other types of instruments that handle charged particles (e.g., an electron microscope).

Figure 7A:
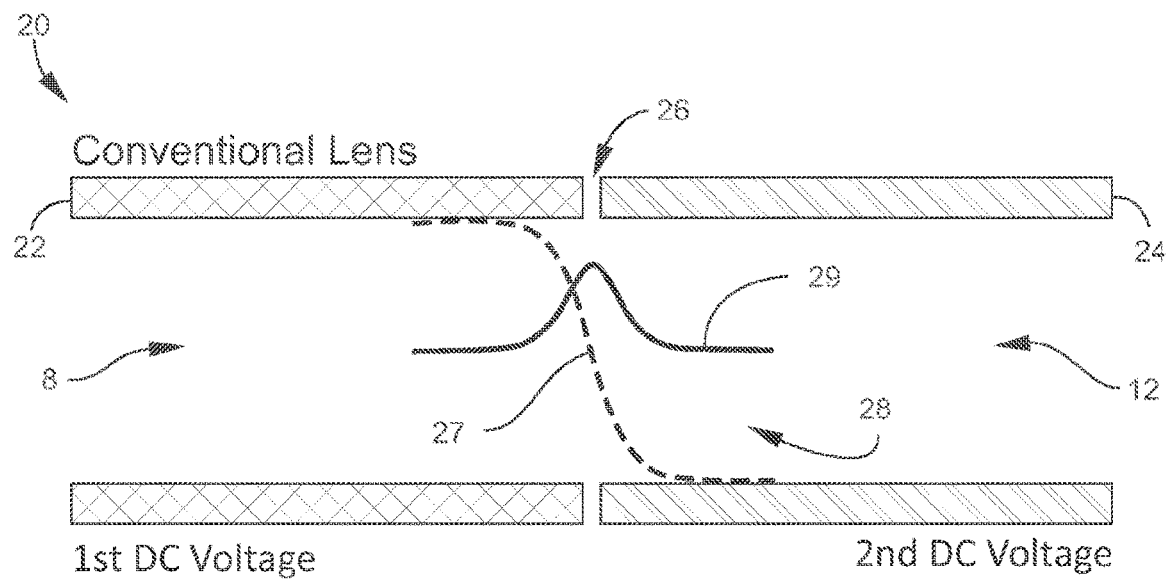
FIG. 7A is a schematic cross-sectional side (lengthwise) view of a conventional electrostatic lens composed of two opposing hollow cylindrical electrodes to which different voltages $V^+$ and $V^-$ are applied, similar to FIG. 3A, and depicting the applied electrostatic field.
Figure 7B:
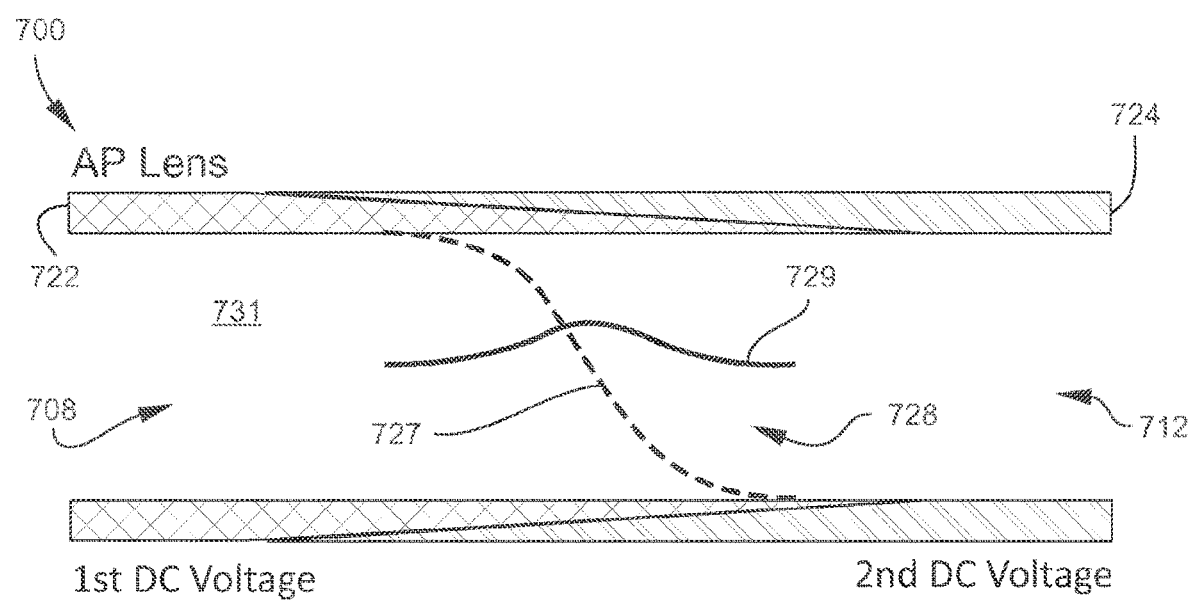
FIG. 7B is a schematic cross-sectional side (lengthwise) view of an AP lens according to one or more embodiments disclosed herein, and depicting the applied electrostatic field.
Figure 7C:
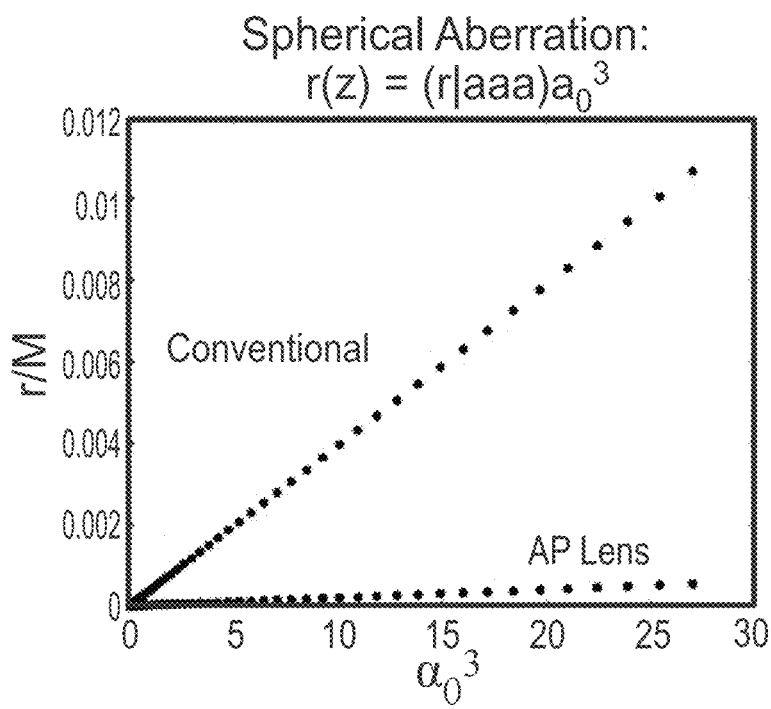
FIG. 7C is a plot of simulated data comparing the spherical aberration of the respective ion beams focused and transported by the conventional electrostatic lens illustrated in FIG. 7A and the AP lens illustrated in FIG. 7B.
Figure 7D:
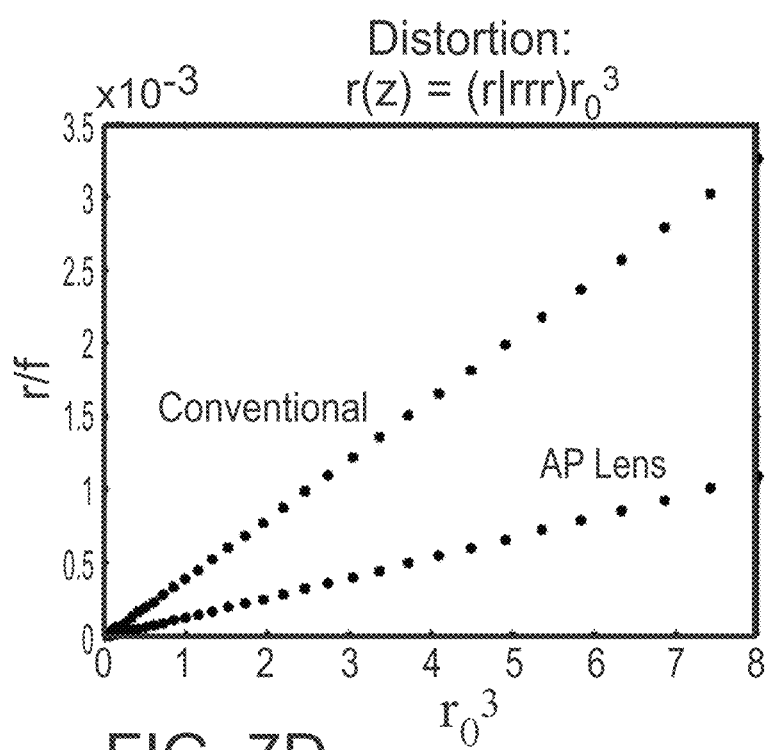
FIG. 7D is a plot of simulated data comparing the positional aberration (distortion) of the respective ion beams focused and transported by the conventional electrostatic lens illustrated in FIG. 7A and the AP lens illustrated in FIG. 7B.

The principle of the AP lens disclosed herein may be further understood by comparing the schematic or conceptual diagrams of FIGS. 7A and 7B, and referring also to the data plots of FIGS. 7C and 7D.

FIG. 7A is a schematic view of a conventional electrostatic lens 20 that includes a first electrode 22 and a second electrode 24 separated by an axial gap 26. The first electrode 22 defines a lens entrance 8 and the second electrode 24 defines an axially opposing lens exit 12 of the conventional electrostatic lens 20. A first DC potential ($V^+$) is applied to the first electrode 22, and a second DC potential of different polarity ($V^-$) is applied to the second electrode 24, as described elsewhere herein, resulting in an axial electrostatic potential field having axial electrostatic potential profile 27 that extends through a transition region 28 as illustrated in FIG. 7A. Typically, the first DC potential is uniformly applied across the axial length of the first electrode 22 (from the lens entrance 8 to the axial gap 26), and the second DC potential is uniformly applied across the axial length of the second electrode 24 (from the axial gap 26 to the lens exit 12). The transition region 28 of the conventional electrostatic lens 20 spans a relatively narrow band (or short axial distance) in the vicinity of the axial gap 26, i.e., at the interface between the adjacent end edges of the first electrode 22 and second electrode 24. This is further illustrated by a peak 29 in FIG. 7A representing the rate of change in the axial electrostatic potential profile 27. The narrow transition region 28 has limitations or disadvantages as described above.

By comparison. FIG. 7B is a schematic view of an AP lens 700 representative of one or more embodiments of the present disclosure. The AP lens 700 includes a first electrode 722 configured to receive a first DC potential from a DC voltage source, and a second electrode 724 configured to receive a second DC potential from the DC voltage source different from the first DC potential (different in magnitude and/or polarity and/or varying profile or function, etc.). As shown by more specific examples below, the first electrode 722 may include a first group (or plurality, or set, etc.) of first electrodes, and the second electrode 724 may include a second group (or plurality, or set, etc.) of second electrodes. Depending on the embodiment, one or more of the first electrode(s) 722, or one or more of both the first electrode(s) 722 and the second electrode(s) 724, define a lens entrance 708 of the AP lens 700; and one or more of the second electrode(s) 724, or one or more of both the first electrode(s) 722 and the second electrode(s) 724, define an axially opposing lens exit 712 of the AP lens 700. Thus, the first electrode 722 (or first group of first electrodes 722) and the second electrode 724 (or second group of second electrodes 724) cooperatively or collectively define a lens interior 731 extending along the lens axis from the lens entrance 708 to the lens exit 712. The first electrode(s) 722 and/or the second electrode(s) 724 have a geometric feature that progressively varies along the axial direction. To facilitate varying the geometry in a uniform and symmetric manner, the first electrode(s) 722 and the second electrode(s) 724 may be interdigitated with each other, some examples of which are described below and illustrated in FIGS. 8A-10C. FIG. 7B schematically illustrates the geometry of the first electrode(s) 722 transitioning into the geometry of the second electrode(s) 724.

In response to the first DC potential applied to the first electrode(s) 722 and the second DC potential applied to the second electrode(s) 724, the first electrode(s) 722 is configured to generate a first electrostatic potential field in the lens interior 731, and the second electrode(s) 724 is configured to generate a second electrostatic potential field in the lens interior 731. Consequently, the first electrode 722 (or first group of first electrodes 722) and the second electrode 724 (or second group of second electrodes 724) are cooperatively configured to generate a composite or overall electrostatic potential field that is a linear superposition of the first electrostatic potential field and the second electrostatic potential field. The structure of the AP lens 700, in particular the first electrode(s) 722 and the second electrode(s) 724, may be considered as comprising (or defining or establishing) a transition region 728 along the axial direction, through which the composite electrostatic potential field progressively varies (changes) along the axial direction in accordance with the progressively varying geometric feature(s) of the first electrode(s) 722 and/or the second electrode(s) 724, as depicted by an axial electrostatic potential profile 727. By this configuration, the relative influences that the first electrode(s) 722 and the second electrode(s) 724 (and thus the applied first and second electrostatic potential fields) have on charged particles (e.g., ions) in the lens interior 731 progressively varies along the axial direction, in particular through the extent of the transition region 728. In other words, the relative weights of the contributions of the first electrostatic potential field/first electrode(s) 722 and the second electrostatic potential field/second electrode(s) 724 to the composite electrostatic potential field progressively varies along the axial direction as dictated by the predetermined electrostatic potential profile 727 through the transition region 728. The axially progressive change in the electrostatic field or potential profile so created (and thus the varying influence on the charged particles) may be quantified by any parameter (or property or attribute) appropriately characteristic of the applied first and second electrostatic potential fields and thus the resulting composite electrostatic potential field or potential profile 727. Generally, the potential profile 727 may be expressed as a variance or change in the superposition ratio of the first and second electrostatic potential fields generated by the first electrode(s) 722 and the second electrode(s) 724 (and their attendant voltages) as one moves along the lens axis. As non-limiting examples, the electrostatic field strength (in volts per meter, V/m) or the magnitude of the electrostatic potential (in V) of the composite electrostatic potential field, or the ratio of the electrostatic field strength to electrostatic potential of the composite electrostatic potential field, or the ratio of the respective field strengths or magnitudes of the first electrostatic field and the second electrostatic field, may progressively change in the axial direction. The superposition ratio (or relative weights or influences) exhibited by the AP lens 700 is fully at the discretion of the designer of the AP lens 700 who determines the configuration (e.g., geometry and arrangement) of the first electrode(s) 722 and second electrode(s) 724.

As one non-exclusive example, at some axial point or over some portion of the axial lens length (e.g., from lens entrance 708 to lens exit 712) of the AP lens 700, the first electrostatic potential field may be the significant or dominant component of the composite electrostatic potential field, while at another axial point or over another portion the second electrostatic potential field may be the significant or dominant component. For example, the first electrostatic potential field may be the dominant component at or near the lens entrance 708, the second electrostatic potential field may be the dominant component at or near the lens exit 712, and the relative contributions of the first and second electrostatic potential fields may be more equalized or similar at some intermediate point or region between the lens entrance 708 and the lens exit 712, and/or the first and second electrostatic potential fields may in effect progressively transform into each other in the axial dimension. In some embodiments (not shown), the first electrode(s) 722 and the second electrode(s) 724 may have uniform geometries in one or more axial sections of the AP lens 700 (as one example, at the entrance end region and/or the exit end region), where the composite electrostatic potential field is constant (does not vary).

By the configuration of the AP lens 700 and more specific embodiments thereof (a few examples of which are described below), with the axially progressively varying geometry of the electrode structure, the transition region 728 is substantially extended in the axial dimension as compared to the relatively abrupt transition region 28 of the conventional electrostatic lens 20 described above, thereby spreading the focusing power of the AP lens 700 over a relatively broad band (or longer axial distance, relative to the conventional electrostatic lens 20). This illustrated in FIG. 7B by a peak 729 representing the rate of change in the axial electrostatic potential profile 727, which may be compared to the peak 29 shown in FIG. 7A. It is seen that AP lens 700 is able to broaden the peak width in the axial electrostatic potential profile 727 while, if desired, preserving the integrity of the peak shape, thereby spreading the converging/diverging power of the AP lens 700 over a broader axial distance according to the predetermined axial electrostatic potential profile 727. Such broadening (i.e., peak shape) may be asymmetric if desired, for example the rate of change in the axial electrostatic potential profile 727 may change over some or all of the axial extent of the transition region 728. Consequently, compared to the conventional electrostatic lens 20, ions injected with the same initial conditions are much better focused in the AP lens 700, as reflected by the substantially reduced geometrical aberrations, which is due at least in part to the smoother axial electrostatic potential axial profile 727 of the electrostatic potential field shown in FIG. 7B. Accordingly, the electrostatic potential profile 727 of the electrostatic field generated by the AP lens 700 is of higher fidelity. i.e., closer to the ideal electric potential profile with optimum focusing power, than that generated by the conventional lens 20.

Generally, the transition region 728 of the AP lens 700 may extend over some (such as the majority or at least a significant portion of) or all of (or substantially all of) the axial lens length of the AP lens 700. As a few non-exclusive examples, the axial length of the transition region 728 may be at least 25% (in the range of 25% to 100%), or in the range of 25% to 50%, or at least 50% (in the range of 50% to 100%), or in the range of 50% to 75%, or at least 75% (in the range of 75% to 100%), or 100% of the axial lens length.

The advantages of the AP lens 700 are further evident from FIGS. 7C and 7D. FIG. 7C is a plot of simulated data comparing the spherical aberration of the respective ion beams focused and transported by a conventional electrostatic lens such as the lens 20 illustrated in FIG. 7A and the AP lens 700 generally represented in FIG. 7B. In FIG. 7C, a) is the initial divergent angle, r is the radial offset at the image plane, and M is the linear magnification. FIG. 7D is a plot of simulated data comparing the positional aberration (distortion) of the respective ion beams focused and transported by the conventional electrostatic lens 20 and the AP lens 700. In FIG. 7D, $r_0$ is the initial radial offset, r is the radial offset at the focal plane, and f is the focal length. FIGS. 7C and 7D demonstrate significant reductions in spherical aberration and positional aberration, respectively, in the case of the AP lens 700.

FIGS. 8A-8F illustrate an example of an axially progressive electrostatic lens (AP lens) 800 according to some embodiments of the present disclosure. The AP lens 800 is configured for focusing and transporting charged particles. As such, the AP lens 800 may be utilized in an instrument or system that processes charged particles.

FIG. 8A is a schematic perspective view of the AP lens 800. The AP lens 800 includes a plurality (or first group) of first electrodes 804A (or "A" electrodes) and a plurality (or second group) of second electrodes 804B (or "B" electrodes). The first electrodes 804A and the second electrodes 804B surround a lens axis of the AP lens 800 (i.e., the device axis of the assembled AP lens 800, which may be a longitudinal or central axis) and corresponding lens interior, and (from the perspective of a transverse plane orthogonal to the lens axis) are positioned at radial distances from the lens axis. By this configuration, the first electrodes 804A and the second electrodes 804B cooperatively define a lens entrance (or charged particle entrance, e.g. ion entrance) 808 coaxial with the lens axis, a lens exit (or charged particle exit, e.g. ion exit) 812 coaxial with the lens axis and axially spaced from the lens entrance 808 along the lens axis, and a lens interior extending along the lens axis between the lens entrance 808 and the lens exit 812. The first electrodes 804A and the second electrodes 804B may be held in fixed positions as an assembly in any suitable manner, with electrical insulators supporting and separating each of the electrodes 804A, 804B.

Specifically in the present embodiment, as best shown in FIG. 8A, the first electrodes 804A and the second electrodes 804B are elongated in the axial direction. Also, FIG. 8B is a schematic end view of the AP lens 800 in the transverse plane at (or near) the lens entrance 808, and FIG. 8C is a schematic end view of the AP lens 800 in the transverse plane at (or near) the lens exit 812. As best shown in FIGS. 8B and 8C, the first electrodes 804A and the second electrodes 804B are circumferentially (azimuthally) arranged about the lens axis.

In the present embodiment, after assembly, the first electrodes 804A and the second electrodes 804B are interdigitated with each other in an alternating manner, and separated from each other by gaps. In particular, the first electrodes 804A and the second electrodes 804B are interdigitated in a circumferential direction in the transverse plane. Accordingly, from the perspective of the transverse plane, each first electrode 804A is disposed between two adjacent second electrodes 804B, and each second electrode 804B is disposed between two adjacent first electrodes 804A. Each gap is bounded by the respective radial sides of a pair of adjacent electrodes 804A, 804B. Generally, the gap size between adjacent first electrodes 804A and second electrodes 804B (i.e., the circumferential or azimuthal spacing in the transverse plane) may be small (e.g., on the order of millimeters (mm)), but should be large enough to avoid voltage breakdown (e.g., electrical arcing) under the operating conditions (e.g., applied voltages and fluid pressure) utilized. As non-exclusive examples, the minimum circumferential spacing between adjacent first electrodes 804A and second electrodes 804B may be 50 mm or less, or 25 mm or less, or 5 mm or less.

In the present embodiment, the first electrodes 804A and the second electrodes 804B have planar geometries, i.e. are plate-shaped.

According to an aspect of the present disclosure, the first electrodes 804A and/or the second electrodes 804B (both electrodes 804A. 804B in the illustrated embodiment) have a geometric (or structural) feature (e.g., shape or dimension) that progressively varies (changes) in the axial direction (i.e., in at least one direction along the lens axis). In the present embodiment, the first electrodes 804A and the second electrodes 804B are axially tapered, i.e. have a geometric feature or dimension that tapers (up or down) along the lens axis.

Figure 8E:
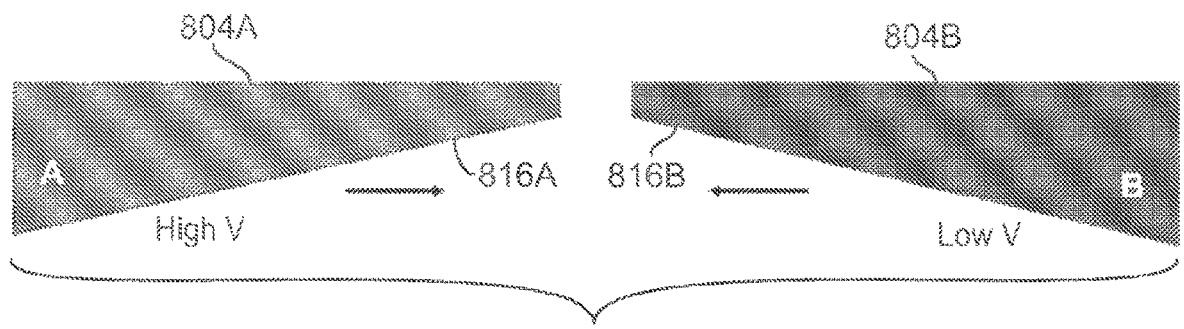
FIG. 8E is a schematic exploded side (lengthwise) view of the pair of electrodes illustrated in FIG. 8D.

Specifically. FIGS. 8D and 8E illustrate the axial profiles (shapes) of each first electrode 804A and second electrode 804B of the AP lens 800 from one axial end to the other axial end. That is. FIGS. 8D and 8E illustrate one side or face of the first electrode 804A and second electrode 804B in a longitudinal plane extending radially from the lens axis. Accordingly, this side or face of the first electrode 804A and second electrode 804B has a radial dimension (e.g., height) orthogonal to the lens axis, and an axial or longitudinal dimension (e.g., length) parallel to the lens axis. Specifically, FIG. 8D is a schematic side (lengthwise) view of one pair of a first electrode 804A and a second electrode 804B in an assembled position relative to the lens axis (the dashed/dotted horizontal line in FIG. 8D). The assembly of the AP lens 800 is completed by arranging a number of such electrode pairs in rotational symmetry about the lens axis, as depicted by the curved arrow in FIG. 8D. FIG. 8E is a schematic exploded side (lengthwise) view of the pair of electrodes 804A, 804B illustrated in FIG. 8D, i.e., showing the first electrode 804A and the second electrode 804B axially spaced apart from each other for illustrative purposes. Each first electrode 804A has a first inside surface (or edge) 816A, and each second electrode 804B has a second inside surface (or edge) 816B, facing the interior of the AP lens 800. In assembled form, the first inside surfaces 816A and second inside surfaces 816B collectively define the size and the shape of the lens interior. In the present embodiment, the inside surfaces 816A, 816B are axially tapered. That is, as best shown in FIGS. 8D and 8E, the radial distance of each first inside surface 816A and second inside surface 816B from the lens axis varies (as one moves) in the axial direction.

In the present embodiment, the geometric feature of the first electrodes 804A progressively varies along the lens axis in an opposite manner in which the geometric feature of the second electrodes 804B progressively varies along the lens axis. Specifically in the illustrated embodiment, the first electrodes 804A and the second electrodes 804B are axially tapered in opposite directions along the lens axis. Thus, the radial distance from the lens axis of each first electrode 804A (at the first inside surface 816A) is at a minimum at the lens entrance 808, is at a maximum at the lens exit 812, and increases in the axial direction from the minimum at the lens entrance 808 to the maximum at the lens exit 812. The radial distance from the lens axis of each second electrode 804B (at the second inside surface 816B) is at a maximum at the lens entrance 808, is at a minimum at the lens exit 812, and decreases in the axial direction from the maximum at the lens entrance 808 to the minimum at the lens exit 812. Consequently, as can be taken from FIG. 8D, the size (e.g. diameter) of the lens interior surrounded by the first electrodes 804A and second electrodes 804B is at a minimum at the lens entrance 808, tapers up (increases) in the axial direction to a maximum at an intermediate axial point (e.g. midpoint) between the lens entrance 808 and the lens exit 812, and tapers back down (decreases) to a minimum at the lens exit 812.

In one embodiment, a first DC potential is applied to the first electrodes 804A, and a second DC potential is applied to the second electrodes 804B. Suitable electronics (electrical circuitry) may be provided to communicate with—and supply controllable, adjustable first DC potentials and second DC potentials to—the respective first electrodes 804A and second electrodes 804B, as appreciated by persons skilled in the art. For example, such electronics may be considered to include a first DC voltage source configured to supply the first DC potential to the first electrodes 804A, and a second DC voltage source configured to supply the second DC potential to the second electrodes 804B. The voltage supply 180 or electronics-based processor 182 shown in FIG. 4 (and/or the power supply 1152 shown in FIG. 11, described below) may be taken to schematically represent the electronics that include the first and second DC voltage sources.

In one embodiment, the first DC potential and the second DC potential are different from each other as needed to impart a potential difference (voltage) between adjacent pairs of the first electrode 804A and second electrode 804B. Thus, the first DC potential and the second DC potential so applied may differ as to magnitude (e.g., the first DC potential may be higher in absolute value relative to the second DC potential, and the second DC potential may be lower in absolute value relative to the first DC potential, or vice versa) and/or polarity (e.g., one or both of the first DC potential and the second DC potential may be negative, or one or both of the first DC potential and the second DC potential may be positive, or one of the first DC potential and the second DC potential may be negative while the other is positive). The magnitude of the first DC potential or the second DC potential may be zero (0 V). In one embodiment, the same first DC potential is applied to all of the first electrodes 804A, and the same second DC potential is applied to all of the second electrodes 804B. For this purpose, the first electrodes 804A may be interconnected to each other and the second electrodes 804B may be interconnected to each other in a known manner.

In operation, the application of the first DC potential to the first electrodes 804A and the second DC potential to the second electrodes 804B establishes an electrostatic field in the lens interior having an axial electrostatic potential profile. In the present embodiment, the axial electrostatic potential profile may be defined based on the geometries of the lens electrodes (first electrodes 804A and second electrodes 804B) that make up the AP lens 800. By selecting appropriate tapering slopes for the lens electrodes (e.g., the function describing or defining the taper), an axial electric field gradient at the vicinity of the lens axis may be established and modified to progressively spread focusing power across a predefined axial distance (e.g., along the axial length of the electrode structure of the AP lens 800 from the entrance end to the exit end) and according to a predefined function. Consequently, in operation, this configuration reduces the geometrical aberrations of the AP lens 800, and may do so substantially.

In one embodiment, both the first electrodes 804A, and the second electrodes 804B have an axially progressive change in shape. In other embodiments, either the first electrodes 804A or the second electrodes 804B have an axially progressive change in shape. For example, in the embodiment best shown in FIGS. 8D and 8E, both the first electrodes 804A, and the second electrodes 804B have tapering slopes along the axial direction, i.e., progressively varying radial distances from the lens axis. However, in an alternative embodiment (not shown), only the first electrodes 804A, or only the second electrodes 804B, have the tapering slope, while the corresponding radial distance from the lens axis of the electrodes of the other group remains constant along the axial direction.

Figure 8F:
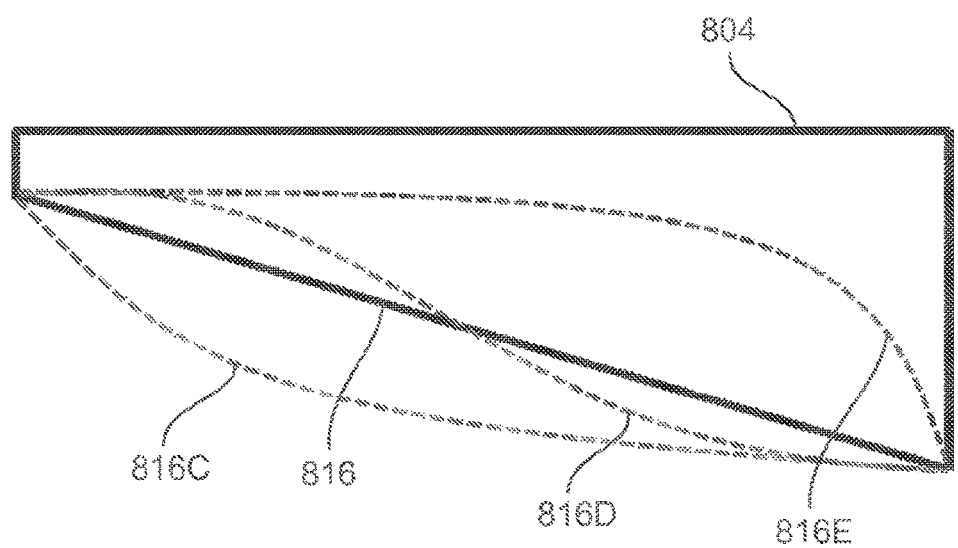
FIG. 8F is a schematic side (lengthwise) view of an electrode of the AP lens illustrated in FIG. 8A illustrating alternative shapes of the electrode.

In the embodiment illustrated in FIGS. 8A-8E, the tapering slopes of the first inside surface 816A and the second inside surface 816B of the first electrodes 804A and second electrodes 804B are linear (straight). In other embodiments, the tapering slopes may be curved according to other predetermined functions. The curved surface or edge may be concave, convex, or include both concave and convex portions, relative to the lens axis. FIG. 8F illustrates a few non-exclusive examples of curved inside surfaces 816C. 816D, and 816E that may be utilized for electrodes 804 (first and/or second electrodes) of the AP lens 800, in comparison to a straight inside surface 816.

It will be understood that in the various embodiments of the AP lens disclosed herein, the number of lens electrodes actually provided in practice may be greater than (or less than) the number of lens electrodes schematically depicted in the drawing figures, as needed to realize a high-fidelity electrostatic field. Generally, the fidelity (and hence smoothness) of the electric potential may be expected to increase or improve as the number of lens electrodes provided in a given embodiment increases. For example, for an electrode structure with lens electrodes circumferentially (azimuthally) arranged about the lens axis, as in the embodiments illustrated in FIGS. 8A-8D or FIGS. 9A-9F (described below), the fidelity of the electric potential in the circumferential dimension (i.e., transverse plane) may improve with an increasing number of lens electrodes. For an electrode structure with lens electrodes axially arranged in series along the lens axis, as in the embodiment illustrated in FIGS. 10A-10C (described below), the fidelity of the electric potential in the axial dimension may improve with an increasing number of lens electrodes.

In configurations of the AP lens where the lens electrodes are circumferentially (or azimuthally) arranged about the lens axis (e.g., the AP lens 800 of FIGS. 8A-8F) the electrodes of each group (e.g., the first electrodes 804A, and the second electrodes 804B) may be further designated or divided into an even number of subgroups (e.g., two, four, six, etc.) in the azimuthal dimension (or transverse plane) for receiving a differential DC voltage. This may be implemented, for example, to allow for steering the ion beam to compensate for mechanical tolerance in manufacturing and assembly.

FIGS. 9A-9F illustrate an example of an AP lens 900 according to another embodiment. The AP lens 900 is configured for focusing and transporting charged particles. As such, the AP lens 900 may be utilized in an instrument or system that processes charged particles.

Figure 9A:
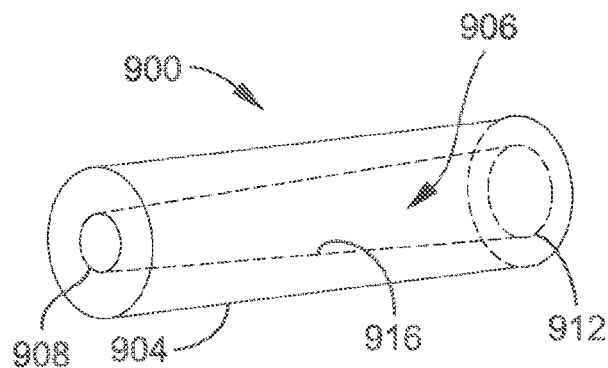
FIG. 9A is a schematic transparent perspective view of an example of an axially progressive electrostatic lens (AP lens) for transporting charged particles according to another embodiment of the present disclosure.
Figure 9B:
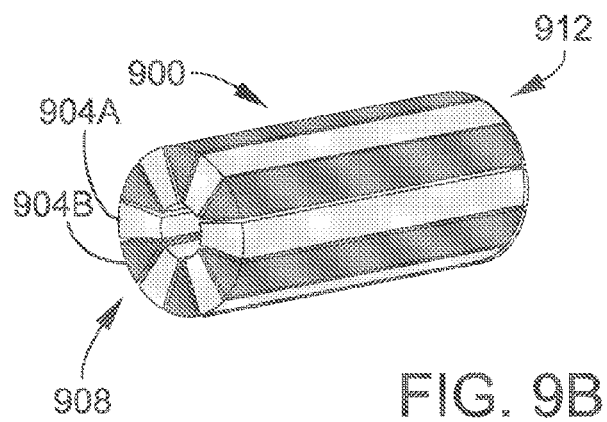
FIG. 9B is a schematic perspective view of the AP lens illustrated in FIG. 9A, showing segmentation of the electrode structure of the AP lens.
Figure 9C:
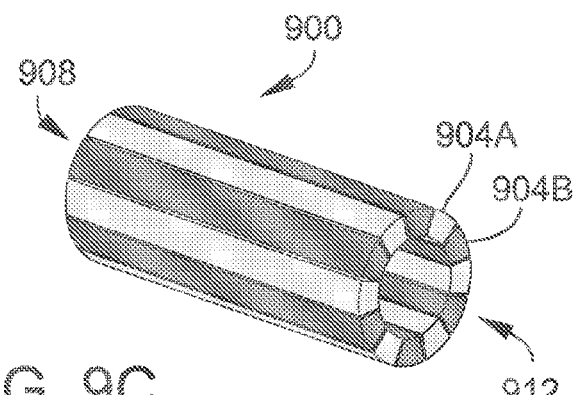
FIG. 9C is another schematic perspective view of the AP lens illustrated in FIGS. 9A and 9B.
Figure 9D:
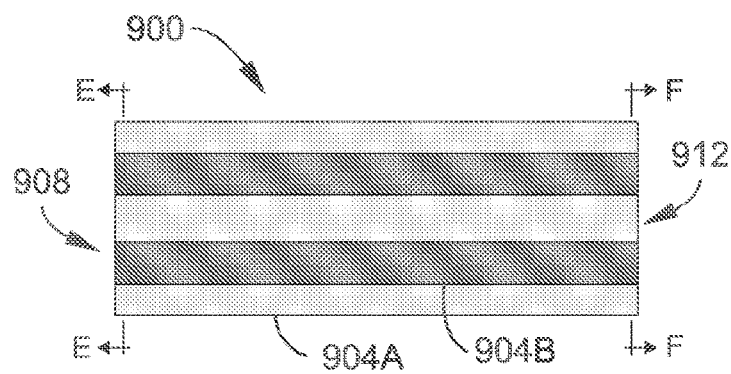
FIG. 9D is a schematic side (lengthwise) view of the AP lens illustrated in FIGS. 9A and 9B.

FIG. 9A is a transparent view of the AP lens 900 showing the overall space (or envelope) occupied by its electrode structure 904. The overall geometry of the electrode structure 904 is that of a hollow cylinder positioned on and surrounding the lens axis of the AP lens 900. The hollow cylindrical electrode structure 904 defines a conical (or tapering) axial conduit (or lens interior) 906 extending from a lens entrance (or charged particle entrance, e.g. ion entrance) 908 to a lens exit (or charged particle exit. e.g. ion exit) 912. The size and shape of the axial conical conduit 906 is defined by an inside surface or envelope 916 of the electrode structure 904.

As shown in FIGS. 9B-9F, from the perspective of the transverse plane (or azimuthal dimension) orthogonal to the lens axis, the electrode structure 904 is circumferentially (or azimuthally) segmented into two groups of electrodes-namely, a plurality (or first group) of first electrodes 904A (or "A" electrodes) and a plurality (or second group) of second electrodes 904B (or "B" electrodes). Hence, the first electrodes 904A and the second electrodes 904B are circumferentially or azimuthally arranged about the lens axis, and are positioned at radial distances from the lens axis. By this configuration, the first electrodes 904A and the second electrodes 904B cooperatively define the lens entrance 908 coaxial with the lens axis, the lens exit 912 coaxial with the lens axis and axially spaced from the lens entrance 908 along the lens axis, and the lens interior extending along the lens axis between the lens entrance 908 and the lens exit 912. As in other embodiments, the first electrodes 904A and the second electrodes 904B may be held in fixed positions in an assembly in any suitable manner, with electrical insulators supporting and separating each of the electrodes 904A. 904B.

Figure 9E:
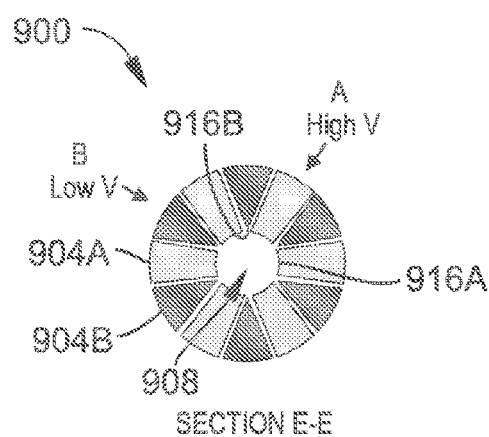
FIG. 9E is a schematic end view of the AP lens illustrated in FIGS. 9A and 9B at an entrance thereof.
Figure 9F:
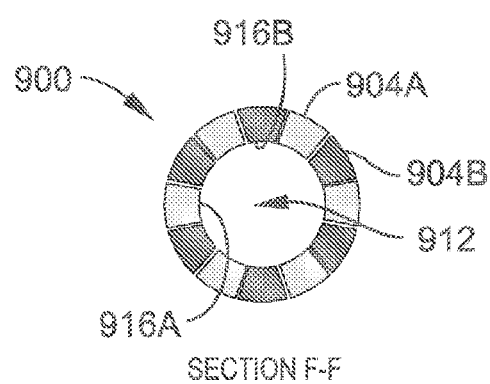
FIG. 9F is a schematic end view of the AP lens illustrated in FIGS. 9A and 9B at an exit thereof, which is axially opposite to the entrance illustrated in FIG. 9E.

As in other embodiments, after assembly, the first electrodes 904A and the second electrodes 904B are interdigitated with each other in an alternating manner. In particular, the first electrodes 904A and the second electrodes 904B are interdigitated in a circumferential direction in the transverse plane. Accordingly, from the perspective of the transverse plane, each first electrode 904A is disposed between two adjacent second electrodes 904B, and each second electrode 904B is disposed between two adjacent first electrodes 904A. FIG. 9E is a schematic end view of the AP lens 900 in the transverse plane E-E at (or near) the lens entrance 908. FIG. 9F is a schematic end view of the AP lens 900 in the transverse plane F-F at (or near) the lens exit 912. As best shown in FIGS. 9E and 9F, the first electrodes 904A and the second electrodes 904B are separated from each other by gaps. Each gap is bounded by the respective radial sides of a pair of adjacent electrodes 904A, 904B. As in other embodiments, the gap size (i.e., the spacing in the transverse plane) between adjacent first electrodes 904A and second electrodes 904B may be on the order of millimeters (mm), with the minimum gap size being, for example, 50 mm or less, or 25 mm or less, or 5 mm or less.

FIGS. 9E and 9F illustrate the transverse cross-sections (the cross-sections in the transverse plane) of the first electrodes 904A and the second electrodes 904B. The transverse cross-sections (also referred to as radial profiles or angular profiles) may be wedge-shaped, for example shaped as circular sectors. Each first electrode 904A has a first inside surface 916A, and each second electrode 904B has a second inside surface 916B, facing the interior of the AP lens 900. The first inside surfaces 916A and second inside surfaces 916B define the size and the shape of the lens interior, particularly the axial conduit 906 depicted in FIG. 9A.

For each first electrode 904A and second electrode 904B, the wedge shape or sector shape of the transverse cross-section is defined in part by the two radial sides of the electrode 904A, 904B, which meet at or adjoin the inside surface 916A, 916B. The two radial sides are non-parallel, thus having an angle between them (i.e., the wedge or sector has a central angle). As evident from FIG. 9E, the intersection of the two radial sides of the electrode 904A. 904B may not coincide with lens axis. Moreover, the angle between the two radial sides of the first electrode 904A may be different from the angle between the two radial sides of the second electrode 904B. This may be characterized as (the transverse cross-section of) the first electrode 904A being angled differently from (the transverse cross-section of) the second electrode 904B.

As in other embodiments, the first electrodes 904A and/or the second electrodes 904B (both electrodes 904A. 904B in the illustrated embodiment) have a geometric (or structural) feature (e.g., shape or dimension) that progressively varies (changes) in the axial direction (i.e., in at least one direction along the lens axis). In the present embodiment, the first electrodes 904A and the second electrodes 904B are axially tapered, i.e. have a geometric feature or dimension that tapers along the lens axis. Specifically in the present embodiment, the first inside surfaces 916A and the second surfaces 916B are axially tapered. That is, the radial distance of each first inside surface 916A and second inside surface 916B from the lens axis varies (as one moves) in the axial direction. In the present embodiment, the first inside surfaces 916A and the second surfaces 916B are axially tapered in the same direction, thereby collectively forming the conical (or tapering) axial conduit 906 shown in FIG. 9A.

In the illustrated embodiment, as shown in FIGS. 9B, 9C, 9E, and 9F, the first electrodes 904A and the second electrodes 904B are axially tapered such that the radial distance from the lens axis of each first electrode 904A (at the first inside surface 916A) and each second electrode 904B (at the second inside surface 916B) is at a minimum at the lens entrance 908, is at a maximum at the lens exit 912, and increases in the axial direction from the minimum at the lens entrance 908 to the maximum at the lens exit 912. Accordingly, the minimum radius (and diameter) of the lens interior (axial conduit 906) is located at the lens entrance 908, and the maximum radius (and diameter) of the lens interior is located at the lens exit 912.

Alternatively, the first electrodes 904A and second electrodes 904B may be axially tapered in the opposite direction (not shown), such that the maximum radius of the lens interior is located at the lens entrance 908 and the minimum radius of the lens interior is located at the lens exit 912—in other words, such that the lens interior (or axial conduit 906) converges instead of diverges in the direction from lens entrance 908 to lens exit 912.

As illustrated, the transverse cross-sections of the first electrode 904A and/or second electrode 904B may be truncated, such that the first inside surface 916A and/or second inside surface 916B has an appreciable dimension (e.g., width or arc length) in the transverse plane (as compared to being a sharper, apical line edge). Due to the axial taper of the first electrodes 904A and second electrodes 904B and the wedge or sector shape of their transverse cross-sections, the extent of truncation of the transverse cross-sections (and accordingly the dimension of the first inside surface 916A and/or second inside surface 916B) varies in the axial direction. In the illustrated example, the extent of truncation (and accordingly the dimension of the first inside surface 916A and/or second inside surface 916B) increases in the axial direction from the lens entrance 908 to the lens exit 912.

Accordingly, in the present embodiment, in addition to the first electrodes 904A and/or the second electrodes 904B being axially tapered, the shape of the transverse cross-sections of the first electrode 904A and/or second electrode 904B progressively varies (as another type of geometric or structural feature) in the axial direction. This is evident, for example, from a comparison of FIGS. 9E and 9F, which show the transverse cross-sections of the first electrodes 904A and second electrodes 904B at two different positions along the lens axis.

Moreover, as best shown in FIGS. 9E and 9F, due to the first electrode 904A and the second electrode 904B being angled differently as noted above, the dimension of the first inside surface 916A is different from the dimension of the second inside surface 916B at any given axial position along the lens axis. Further, the dimension of the first inside surface 916A may vary in the axial direction (e.g., increase in the illustrated embodiment) at a different rate than the dimension of the second inside surface 916B. Consequently, the ratio of exposure of the first electrodes 904A (at the first inside surfaces 916A) to exposure of the second electrodes 904B (at the second inside surfaces 916B) to the lens interior may progressively vary (as another type of geometric or structural feature) in the axial direction. Stated in another way, the ratio of exposure of the inner surface areas of the first electrodes 904A and second electrodes 904B to the lens interior (or, the ratio of the amounts of inner surface areas exposed to the lens interior) may vary in the axial direction.

In addition, with the first electrode 904A and the second electrode 904B being angled differently, the shape of the transverse cross-section of the first electrodes 904A is different from the shape of the transverse cross-section of the second electrodes 904B at any given axial position along the lens axis.

In one embodiment, a first DC potential is applied to the first electrodes 904A, and a second DC potential is applied to the second electrodes 904B, utilizing suitable electronics (e.g., a first DC voltage source and a second DC voltage source) as described herein. In one embodiment, the first DC potential and the second DC potential are different from each other—in terms of magnitude (e.g., high and low (or zero)) and/or polarity (e.g., positive and negative)—as needed to impart a potential difference (voltage) between adjacent pairs of the first electrode 904A and second electrode 904B. In one embodiment, the same first DC potential is applied to all of the first electrodes 904A, and the same second DC potential is applied to all of the second electrodes 904B. For this purpose, the first electrodes 904A may be interconnected to each other and the second electrodes 904B may be interconnected to each other in a known manner.

In operation, the application of the first DC potential to the first electrodes 904A and the second DC potential to the second electrodes 904B establishes an electrostatic field in the lens interior having an axial electrostatic potential profile. As in other embodiments, the axial electrostatic potential profile is defined based on the geometries of the electrodes (first electrodes 904A, and second electrodes 904B) that make up the AP lens 900. In the present embodiment, the electrostatic potential profile progressively varies in the axial direction (longitudinal dimension) with, for example, the varying ratio of exposure of the inner surface areas of the first electrodes 904A and second electrodes 904B to the lens interior. By selecting appropriate tapering slopes for the first electrodes 904A and second electrodes 904B, which in the present embodiment corresponds to selecting an appropriate apex angle of the conical axial conduit 906 or lens interior, an axial electric field at the vicinity of lens axis with a target (or desired) field gradient may be established and modified to progressively spread focusing power across a predefined axial distance (e.g., along the axial length of the electrode structure 904 of the AP lens 900 from the entrance end to the exit end) and according to a predefined function. The AP lens 900 can produce an axially progressive electric field that is the same as or similar to the AP lens 800 described above in conjunction with FIGS. 8A-8D. Thus, this configuration can reduce the geometrical aberrations of the AP lens 900 according to the same or similar concept of the AP lens 800, and the reduction in geometrical aberrations may be substantial.

Figure 10A:
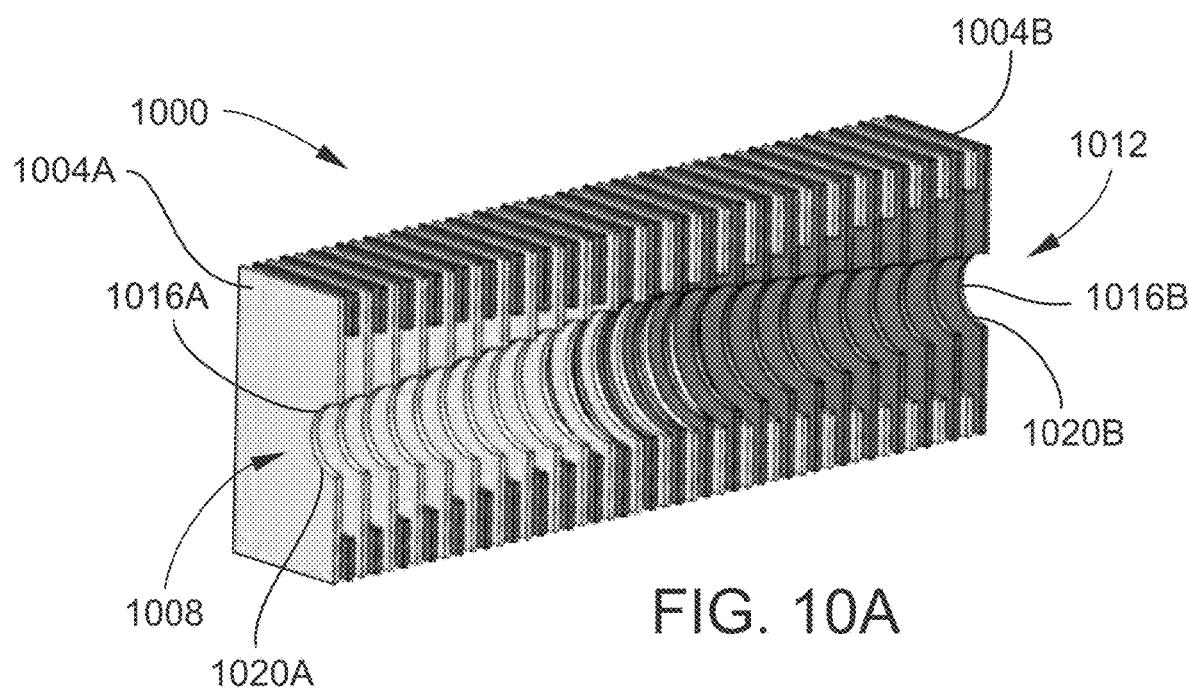
FIG. 10A is a schematic cut-away perspective view of an example of an AP lens for transporting charged particles according to another embodiment of the present disclosure.
Figure 10B:
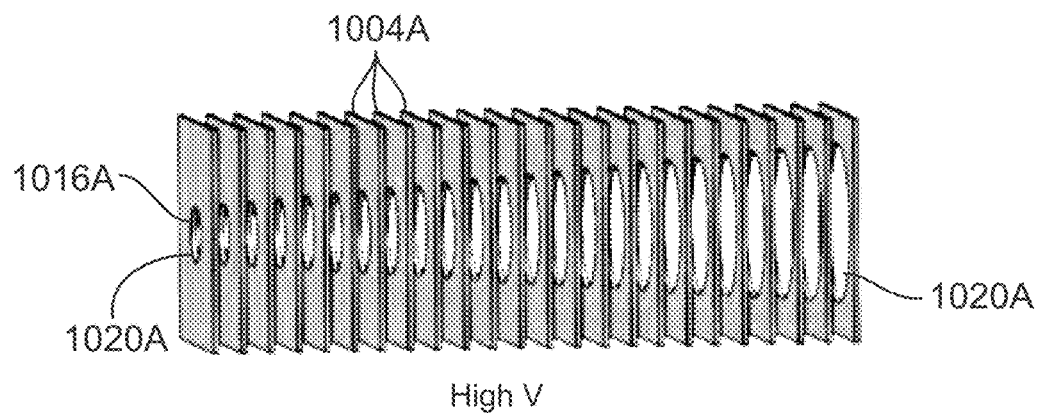
FIG. 10B is a schematic cut-away perspective view of a set of first electrodes of the AP lens illustrated in FIG. 10A.
Figure 10C:
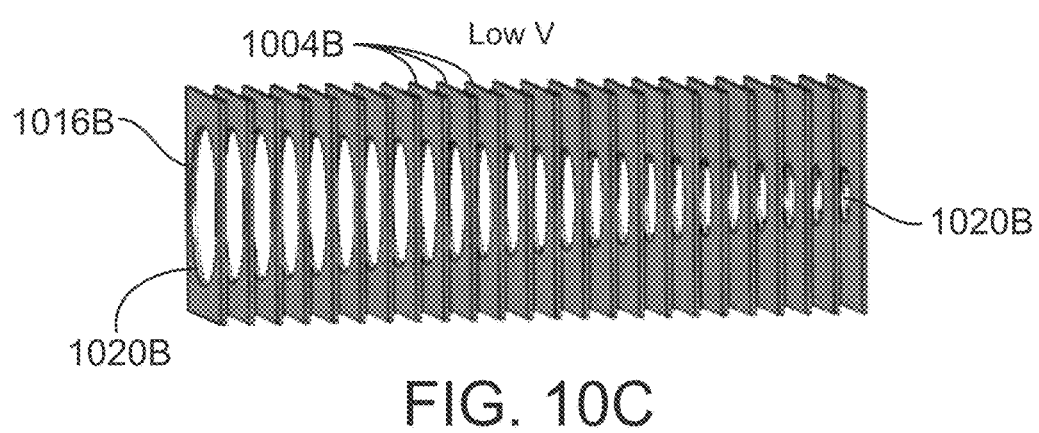
FIG. 10C is a schematic cut-away perspective view of a set of second electrodes of the AP lens illustrated in FIG. 10A.

FIGS. 10A-10C illustrate an example of an AP lens 1000 according to another embodiment. The AP lens 1000 is configured for focusing and transporting charged particles. As such, the AP lens 1000 may be utilized in an instrument or system that processes charged particles.

FIG. 10A is a schematic cut-away perspective view of the AP lens 1000. The AP lens 1000 includes a plurality (or first group) of first electrodes 1004A (or "A" electrodes) and a plurality (or second group) of second electrodes 1004B (or "B" electrodes). FIG. 10B illustrates the set of first electrodes 1004A, and FIG. 10C illustrates the set of second electrodes 1004B, prior to assembly of the AP lens 1000. The first electrodes 1004A are axially arranged in series along the lens axis of the AP lens 1000. The second electrodes 1004B also are axially arranged in series along the lens axis. As in other embodiments, after assembly, the first electrodes 1004A and the second electrodes 1004B are interdigitated with each other in an alternating manner, and are separated from each other by gaps. In the present embodiment, the first electrodes 1004A and the second electrodes 1004B are interdigitated in the axial direction (along the lens axis), and the gaps are axial gaps. Accordingly, in the axial/longitudinal dimension, each first electrode 1004A (unless it is an axial end electrode) is disposed between two adjacent second electrodes 1004B, and each second electrode 1004B (unless it is an axial end electrode) is disposed between two adjacent first electrodes 1004A.

As in other embodiments, the gap size (here, the spacing in the axial, or longitudinal, dimension) between adjacent first electrodes 1004A and second electrodes 1004B may be on the order of millimeters (mm), with the minimum gap size being, for example, 50 mm or less, or 25 mm or less, or 5 mm or less. The first electrodes 1004A and the second electrodes 1004B may be held in fixed positions in an assembly in any suitable manner, with electrical insulators supporting and separating each of the electrodes 1004A, 1004B.

In the present embodiment, each first electrode 1004A has a first inside surface 1016A defining a first electrode aperture 1020A coaxial with the lens axis, and each second electrode 1004B has a second inside surface 1016B defining a second electrode aperture 1020B coaxial with the lens axis, whereby the apertures 1020A, 1020B are positioned in alignment with each other on the lens axis. By this configuration, the first electrodes 1004A and the second electrodes 1004B cooperatively define a lens entrance (or charged particle entrance, e.g. ion entrance) 1008 coaxial with the lens axis, a lens exit (or charged particle exit, e.g. ion exit) 1012 coaxial with the lens axis and axially spaced from the lens entrance 1008 along the lens axis, and a lens interior extending along the lens axis between the lens entrance 1008 and the lens exit 1012.

In the illustrated embodiment, the first electrodes 1004A and the second electrodes 1004B have planar geometries, i.e. are plate-shaped, with the first apertures 1020A and second apertures 1020B formed through the plate thicknesses. The planar geometry of the first electrodes 1004A and second electrodes 1004B may be polygonal, disk-shaped, or some combination of polygonal and disk-shaped features. Alternatively, the first electrodes 1004A and the second electrodes 1004B may be toroidal or ring-shaped to realize the first apertures 1020A and second apertures 1020B. In a typical embodiment, the first apertures 1020A and second apertures 1020B are circular (as illustrated), but alternatively may be polygonal.

As in other embodiments, the first electrodes 1004A and/or the second electrodes 1004B (both electrodes 1004A, 1004B in the illustrated embodiment) have a geometric (or structural) feature (e.g., shape or dimension) that progressively varies (changes) in an axial direction (i.e., in at least one direction along the lens axis). In the present embodiment, the first electrodes 1004A (by way of the first apertures 1020A, as an axially arranged group) and/or the second electrodes 1004B (by way of the second apertures 1020B, as an axially arranged group) are (collectively) axially tapered along the lens axis, in the sense that the size of the first apertures 1020A varies (increases or decreases) progressively from one first electrode 1004A to the next, and/or the size of the second apertures 1020B varies (increases or decreases) progressively from one second electrode 1004B to the next. Accordingly, in the present embodiment, the aperture size of the first electrodes 1004A and/or the second electrodes 1004B varies (as another type of geometric or structural feature) in the axial direction. The sizes of the first apertures 1020A and the second apertures 1020B may be defined by their respective radii, i.e., radial distances in the transverse plane from the lens axis to the first inside surface 1016A or second inside surface 1016B. Hence, the first inside surfaces 1016A and second inside surfaces 1016B define the size and the shape of the lens interior, and the size varies (as one moves) in the axial direction.

In the present embodiment, the geometric feature of the first electrodes 1004A progressively varies along the lens axis in an opposite manner in which the geometric feature of the second electrodes 1004B progressively varies along the lens axis. Specifically in the illustrated embodiment, the first electrodes 1004A and the second electrodes 1004B are axially tapered in opposite directions. Specifically, the first of the first electrodes 1004A (the leftmost first electrode 1004A in FIGS. 10A and 10B) has the smallest first aperture 1020A, and the last of the first electrodes 1004A (the rightmost first electrode 1004A in FIGS. 10A and 10B) has the largest first aperture 1020A. On the other hand, the first of the second electrodes 1004B (the leftmost second electrode 1004B in FIGS. 10A and 10C) has the largest second aperture 1020B, and the last of the second electrodes 1004B (the rightmost second electrode 1004B in FIGS. 10A and 10C) has the smallest second aperture 1020B. The smallest first aperture 1020A corresponds to or defines the lens entrance 1008, and the smallest second aperture 1020B corresponds to or defines the lens exit 1012.

Thus, the radius of the first apertures 1020A is at a minimum at the lens entrance 1008, is at a maximum at (or near) the lens exit 1012, and increases in the axial direction from the minimum at the lens entrance 1008 to the maximum at the lens exit 1012. The radius of the second apertures 1020B is at a maximum at (or near) the lens entrance 1008, is at a minimum at the lens exit 1012, and decreases in the axial direction from the maximum at the lens entrance 1008 to the minimum at the lens exit 1012. Consequently, as can be taken from FIG. 10A, and similar to the embodiment described above in conjunction with FIG. 8D, the size (e.g. diameter) of the lens interior surrounded by the first electrodes 1004A and second electrodes 1004B is at a minimum at the lens entrance 1008, tapers up (increases) in the axial direction to a maximum at an intermediate axial point (e.g. midpoint) between the lens entrance 1008 and the lens exit 1012, and tapers back down (decreases) to a minimum at the lens exit 1012.

In one embodiment, a first DC potential is applied to the first electrodes 1004A, and a second DC potential is applied to the second electrodes 1004B, utilizing suitable electronics (e.g., a first DC voltage source and a second DC voltage source) as described herein. In one embodiment, the first DC potential and the second DC potential are different from each other—in terms of magnitude (e.g., high and low (or zero)) and/or polarity (e.g., positive and negative)—as needed to impart a potential difference (voltage) between adjacent pairs of the first electrode 1004A and second electrode 1004B. In one embodiment, the same first DC potential is applied to all of the first electrodes 1004A, and the same second DC potential is applied to all of the second electrodes 1004B. For this purpose, the first electrodes 1004A may be interconnected to each other and the second electrodes 1004B may be interconnected to each other in a known manner. For example, the electrode structures shown in FIGS. 10B and 10C may be comb-like.

In operation, the application of the first DC potential to the first electrodes 1004A and the second DC potential to the second electrodes 1004B establishes an electrostatic field in the lens interior having an axial electrostatic potential profile. As in other embodiments, the axial electrostatic potential profile is defined based on the geometries of the electrodes (first electrodes 1004A and second electrodes 1004B) that make up the AP lens 1000. In the present embodiment, the electrostatic potential profile varies in the axial direction (longitudinal dimension) in accordance with the step-wise, progressive varying of the radii of the first apertures 1020A and the second apertures 1020B in opposite directions. The step-wise, progressive variation in radii in the groups of first electrodes 1004A and second electrodes 1004B may be in accordance with a predefined function. By selecting an appropriate function or pattern of the variation in radii, the AP lens 1000 can produce an axially progressive electric field that is the same as or similar to the AP lens 800 described above in conjunction with FIGS. 8A-8D. Thus, this configuration can reduce the geometrical aberrations of the AP lens 1000 according to the same or similar concept of the AP lens 800, and the reduction in geometrical aberrations may be substantial.

Figure 11:
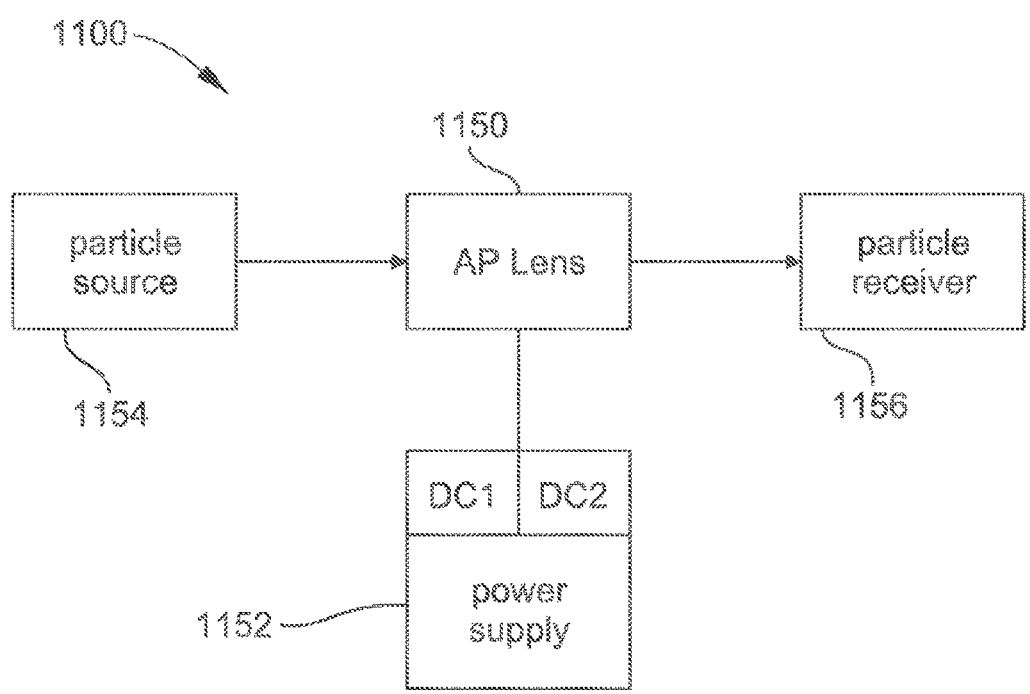
FIG. 11 is a schematic view of an example of a charged particle processing apparatus (or device, instrument, system, etc.) according to some embodiments, in which an AP lens as disclosed herein may be provided.

FIG. 11 is a schematic view of an example of a charged particle processing apparatus 1100 (or device, instrument, system, etc.) according to some embodiments. The apparatus 1100 includes an AP lens 1150 configured according to any of the embodiments disclosed herein. Depending on the specific type of apparatus, the apparatus 1100 may include other components configured for transporting or guiding charged particles, and/or for performing other types of processing of charged particles such as, for example, charged particle beam production, beam steering, acceleration, cooling, filtering, analyzing, detecting, measuring, imaging, etc. As one non-exclusive example, the apparatus 1100 may be an ion processing apparatus such as, for example, a mass spectrometer, ion mobility spectrometer, gas leak detector, or ion optics. One example of a mass spectrometer is described above and illustrated in FIG. 4. As another non-exclusive example, the apparatus 1100 may be an electron microscope such as a transmission electron microscope (TEM), scanning electron microscope (SEM), or the like, or an electron gun, or electron optics.

In the general example of FIG. 1, the apparatus 1100 includes a power supply 1152 in electrical communication with the AP lens 1150. Generally, the power supply 1152 is or includes a DC voltage source, and is configured to supply the electric potentials required to operate the AP lens 1150 in accordance with the concepts disclosed herein. For example, the power supply 1152 may be considered to include a first DC voltage source DC1 for supplying the first DC potential to the first ("A") electrodes, and a second DC voltage source DC2 for supplying the second DC potential to the second ("B") electrodes, as described herein. In some embodiments, the power supply 1152 (or first DC voltage source DC1 and second DC voltage source DC2) may be considered as being part of the AP lens 1150 (e.g., as an assembly).

The apparatus 1100 may further include any appropriate type of charged particle source 1154 configured to supply a beam of charged particles to the AP lens 1150, and/or any appropriate type of charged particle receiver 1156 configured to receive a beam of charged particles from the AP lens 1150.

The charged particle source 1154 may communicate with the lens entrance of the AP lens 1150 via a charged particle path defined by the type of apparatus 1100 provided, which may include one or more intermediate components for processing or transporting the charged particles such as other charged particle optics, etc. The charged particle source 1154 may include components configured to produce (e.g., ionize, emit, etc.) charged particles (e.g., via ionization of a substance, emission from a material, etc.) and/or focus charged particles into a beam and/or transmit (a beam of) charged particles to the AP lens 1150. Examples of a charged particle source 1154 include, but are not limited to, an ion source or ion processing device (such as described above in conjunction with FIG. 4), an ion analyzer (e.g., mass filter, mass analyzer, ion mobility cell, etc.), an electron source (e.g., an electron emitter such as a directly or indirectly heated thermionic cathode or filament, electron gun, etc.), etc.

The charged particle receiver 1156 may communicate with the lens exit of the AP lens 1150 via a charged particle path defined by the type of apparatus 1100 provided, which may include one or more intermediate components for processing or transporting the charged particles such as other charged particle optics, etc. Examples of a charged particle receiver 1156 include, but are not limited to, an ion analyzer (e.g., mass filter, mass analyzer, TOF analyzer, ion mobility cell, etc.), a sample to be irradiated or imaged, a sample holder or sample stage, a charged particle detector (e.g., ion detector, electron detector, imaging device, etc.), an electron collector, trap or anode, etc.

Exemplary Embodiments

Exemplary embodiments provided in accordance with the presently disclosed subject matter include, but are not limited to, the following:

1. An electrostatic lens for transporting charged particles in an axial direction of a lens axis, the electrostatic lens comprising: a first group of first electrodes configured to receive a first DC potential from a DC voltage source and generate a first electrostatic field; and a first group of first electrodes configured to receive a first DC potential from a DC voltage source and generate a first electrostatic field; and; and a second group of second electrodes configured to receive a second DC potential from the DC voltage source different from the first DC potential and generate a second electrostatic field, wherein: the first electrodes are interdigitated with the second electrodes; at least one of the first group or the second group has a geometric feature that progressively varies along the axial direction; the first group and the second group are configured to generate a composite electrostatic field in the lens interior comprising a superposition of the first electrostatic field and the second electrostatic field; and the first group and the second group define a transition region through which a ratio of respective field strengths of the first electrostatic field and the second electrostatic field progressively varies along the axial direction in accordance with the progressively varying geometric feature.

2. The electrostatic lens of embodiment 1, wherein the electrostatic lens has an axial lens length from the lens entrance to the lens exit, and the transition region has an axial length selected from the group consisting of: at least 25% of the axial lens length; at least 50% of the axial lens length; and at least 75% of the axial lens length.

3. The electrostatic lens of embodiment 1 or 2, wherein both the first group and the second group have the geometric feature that progressively varies along the axial direction.

4. The electrostatic lens of embodiment 3, wherein the geometric feature of the first group progressively varies along the lens axis, and the geometric feature of the second group progressively varies in an opposite manner along the lens axis.

5. The electrostatic lens of any of the preceding embodiments, wherein the first electrodes and the second electrodes are elongated in the axial direction.

6. The electrostatic lens of any of the preceding embodiments, wherein the first electrodes and the second electrodes are plate-shaped.

7. The electrostatic lens of any of the preceding embodiments, wherein the first electrodes and the second electrodes surround the lens axis, and are interdigitated in a circumferential direction in a transverse plane orthogonal to the lens axis.

8. The electrostatic lens of any of the preceding embodiments, wherein the first electrodes and the second electrodes surround the lens axis, and have apertures on the lens axis.

9. The electrostatic lens of any of the preceding embodiments, wherein the first electrodes and the second electrodes surround the lens axis, and are interdigitated along the lens axis.

10. The electrostatic lens of any of the preceding embodiments, wherein the first electrodes have first inside surfaces facing a lens interior of the electrostatic lens, the second electrodes have second inside surfaces facing the lens interior, and at least one of the first inside surfaces or the second inside surfaces are axially tapered.

11. The electrostatic lens of embodiment 10, wherein at least one of the first inside surfaces or the second inside surfaces are linearly tapered.

12. The electrostatic lens of embodiment 10, wherein at least one of the first inside surfaces or the second inside surfaces are tapered according to a curve function.

13. The electrostatic lens of any of embodiments 10-12, wherein both the first inside surfaces and the second inside surfaces are axially tapered.

14. The electrostatic lens of embodiment 13, wherein the first inside surfaces and the second inside surfaces are axially tapered in the same direction.

15. The electrostatic lens of embodiment 13, wherein the first inside surfaces and the second inside surfaces are axially tapered in opposite directions.

16. The electrostatic lens of any of the preceding embodiments, wherein: the first electrodes and the second electrodes surround the lens axis; the first electrodes have first transverse cross-sections in a transverse plane orthogonal to the lens axis; the second electrodes have second transverse cross-sections in the transverse plane; and at least one of the first transverse cross-sections or the second transverse cross-sections has a shape that progressively varies along the axial direction.

17. The electrostatic lens of embodiment 16, wherein at least one of the first transverse cross-sections or the second transverse cross-sections are wedge-shaped.

18. The electrostatic lens of embodiment 16 or 17, wherein the shape of the first transverse cross-sections is different from the shape of the second transverse cross-sections at any position along the lens axis.

19. The electrostatic lens of any of the preceding embodiments, wherein the first electrodes have first inside surfaces facing a lens interior of the electrostatic lens, the second electrodes have second inside surfaces facing the lens interior, and the ratio of exposure of the first inside surfaces to exposure of the second inside surfaces to the lens interior progressively varies along the axial direction.

20. The electrostatic lens of any of the preceding embodiments, wherein: the first electrodes and the second electrodes surround the lens axis; the first electrodes have first apertures on the lens axis; the second electrodes have second apertures on the lens axis; and at least one of the first apertures or the second apertures progressively vary in size along the axial direction.

21. The electrostatic lens of embodiment 20, wherein both the first apertures and the second apertures progressively vary in size along the axial direction.

22. The electrostatic lens of embodiment 21, wherein the first apertures and the second apertures vary in size in opposite directions.

23. The electrostatic lens of any of the preceding embodiments, comprising a first DC voltage source configured to apply the first DC potential to the first electrodes, and a second DC voltage source configured to apply the second DC potential to the second electrodes.

24. An electrostatic lens for transmitting charged particles in an axial direction of a lens axis, the electrostatic lens comprising: a first group of first electrodes configured to receive a first DC potential from a DC voltage source; and a second group of second electrodes configured to receive a second DC potential from the DC voltage source different from the first DC potential, wherein: the first group and the second group surround a lens entrance, a lens exit, and a lens interior extending along the lens axis from the lens entrance to the lens exit; and the first group and the second group are configured to generate an axial potential profile in the lens interior that progressively changes along the axial direction and progressively spreads focusing power along the axial direction.

25. The electrostatic lens of embodiment 24, wherein at least one of the first group or the second group has a geometric feature that progressively varies along the axial direction.

26. The electrostatic lens of embodiment 24, comprising one or more features of one or more of the preceding embodiments.

27. A charged particle processing apparatus, comprising: the electrostatic lens of any of the preceding embodiments; and one or more of the following features: a charged particle receiver configured to receive charged particles from the electrostatic lens; a DC voltage source configured to apply the first DC potential to the first electrodes and the second DC potential to the second electrodes; and/or a charged particle source configured to supply charged particles to the electrostatic lens.

28. The charged particle processing apparatus of embodiment 27, configured as a mass spectrometer, an ion mobility spectrometer, or an electron microscope.

29. A method for transporting charged particles in an axial direction of a lens axis, the method comprising: supplying charged particles to a lens interior of the electrostatic lens of any of the preceding embodiments; and applying the first DC potential to the first electrodes and the second DC potential to the second electrodes to generate an axial potential profile in the lens interior to which the charged particles are subjected, wherein the axial potential profile progressively changes along the axial direction and progressively spreads focusing power along the axial direction.

30. The method of embodiment 29, wherein the supplying comprises transmitting the charged particles from a charged particle source.

31. The method of embodiment 29 or 30, wherein the supplying comprises producing ions from a sample or emitting electrons from a material.

31. The method of any of embodiments 29-31, comprising transmitting the charged particles from the electrostatic lens to a charged particle receiver.

32. The method of embodiment 31, comprising operating the charged particle receiver to collect, detect, analyze, measure, or count the charged particles received.

It will be understood that terms such as "communicate" and "in . . . communication with" (for example, a first component "communicates with" or "is in communication with" a second component) are used herein to indicate a structural, functional, mechanical, electrical, signal, optical, magnetic, electromagnetic, ionic or fluidic relationship between two or more components or elements. As such, the fact that one component is said to communicate with a second component is not intended to exclude the possibility that additional components may be present between, and/or operatively associated or engaged with, the first and second components.

It will be understood that various aspects or details of the invention may be changed without departing from the scope of the invention. Furthermore, the foregoing description is for the purpose of illustration only, and not for the purpose of limitation—the invention being defined by the claims.

What is claimed is:

1. An electrostatic lens for transporting charged particles in an axial direction of a lens axis, the electrostatic lens comprising:
a first group of first electrodes configured to receive a first DC potential from a DC voltage source and generate a first electrostatic field; and
a second group of second electrodes configured to receive a second DC potential from the DC voltage source different from the first DC potential and generate a second electrostatic field, wherein:
the first electrodes are interdigitated with the second electrodes;
the first group and the second group define a lens interior extending along the lens axis from a lens entrance to a lens exit;
at least one of the first group or the second group has a geometric feature that progressively varies along the axial direction;
the first group and the second group are configured to generate a composite electrostatic field in the lens interior comprising a superposition of the first electrostatic field and the second electrostatic field; and
the first group and the second group define a transition region through which a ratio of respective field strengths of the first electrostatic field and the second electrostatic field progressively varies along the axial direction in accordance with the progressively varying geometric feature.

2. The electrostatic lens of claim 1, wherein the electrostatic lens has an axial lens length from the lens entrance to the lens exit, and the transition region has an axial length selected from the group consisting of: at least 25% of the axial lens length; at least 50% of the axial lens length; and at least 75% of the axial lens length;.

3. The electrostatic lens of claim 1, wherein both the first group and the second group have the geometric feature that progressively varies along the axial direction.

4. The electrostatic lens of claim 3, wherein the geometric feature of the first group progressively varies along the lens axis, and the geometric feature of the second group progressively varies in an opposite direction in an opposite manner along the lens axis.

5. The electrostatic lens of claim 1, wherein the first electrodes and the second electrodes are elongated in the axial direction.

6. The electrostatic lens of claim 1, wherein the first electrodes and the second electrodes are plate-shaped.

7. The electrostatic lens of claim 1, wherein the first electrodes and the second electrodes surround the lens axis, and are interdigitated in a circumferential direction in a transverse plane orthogonal to the lens axis.

8. The electrostatic lens of claim 1, wherein the first electrodes and the second electrodes surround the lens axis, and have a configuration selected from the group consisting of: the first electrodes and the second electrodes have apertures on the lens axis; the first electrodes and the second electrodes are interdigitated along the lens axis; and both of the foregoing.

9. The electrostatic lens of claim 1, wherein the first electrodes have first inside surfaces facing a lens interior of the electrostatic lens, the second electrodes have second inside surfaces facing the lens interior, and at least one of the first inside surfaces or the second inside surfaces are axially tapered.

10. The electrostatic lens of claim 9, wherein both the first inside surfaces and the second inside surfaces are axially tapered.

11. The electrostatic lens of claim 10, wherein the first inside surfaces and the second inside surfaces have a configuration selected from the group consisting of: the first inside surfaces and the second inside surfaces are axially tapered in the same direction; and the first inside surfaces and the second inside surfaces are axially tapered in opposite directions.

12. The electrostatic lens of claim 1, wherein:
the first electrodes and the second electrodes surround the lens axis;
the first electrodes have first transverse cross-sections in a transverse plane orthogonal to the lens axis;
the second electrodes have second transverse cross-sections in the transverse plane; and
at least one of the first transverse cross-sections or the second transverse cross-sections has a shape that progressively varies along the axial direction.

13. The electrostatic lens of claim 12, wherein at least one of the first transverse cross-sections or the second transverse cross-sections are wedge-shaped.

14. The electrostatic lens of claim 12, wherein the shape of the first transverse cross-sections is different from the shape of the second transverse cross-sections at any position along the lens axis.

15. The electrostatic lens of claim 1, wherein the first electrodes have first inside surfaces facing a lens interior of the electrostatic lens, the second electrodes have second inside surfaces facing the lens interior, and the ratio of exposure of the first inside surfaces to exposure of the second inside surfaces to the lens interior progressively varies along the axial direction.

16. The electrostatic lens of claim 1, wherein:
the first electrodes and the second electrodes surround the lens axis;
the first electrodes have first apertures on the lens axis;
the second electrodes have second apertures on the lens axis; and
at least one of the first apertures or the second apertures progressively vary in size along the axial direction.

17. The electrostatic lens of claim 16, wherein both the first apertures and the second apertures progressively vary in size along the axial direction.

18. The electrostatic lens of claim 17, wherein the first apertures and the second apertures vary in size in opposite directions.

19. A charged particle processing apparatus, comprising:
the electrostatic lens of claim 1; and
a component selected from the group consisting of: a DC voltage source configured to apply the first DC potential to the first electrodes and the second DC potential to the second electrodes; a charged particle source configured to supply charged particles to the electrostatic lens; a charged particle receiver configured to receive charged particles from the electrostatic lens; and a combination of two or more of the foregoing.

20. A method for transporting charged particles in an axial direction of a lens axis, the method comprising:
supplying charged particles to a lens interior of the electrostatic lens of claim 1; and
applying the first DC potential to the first electrodes and the second DC potential to the second electrodes to generate an axial potential profile in the lens interior to which the charged particles are subjected,
wherein the axial potential profile progressively changes along the axial direction and progressively spreads focusing power along the axial direction.

* * * * *